United States Patent
Yang

(10) Patent No.: US 9,513,995 B2
(45) Date of Patent: Dec. 6, 2016

(54) METHODS FOR ACCESSING A STORAGE UNIT OF A FLASH MEMORY AND APPARATUSES USING THE SAME

(71) Applicant: Silicon Motion, Inc., Jhubei (TW)

(72) Inventor: Tsung-Chieh Yang, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 199 days.

(21) Appl. No.: 14/330,887

(22) Filed: Jul. 14, 2014

(65) Prior Publication Data

US 2015/0058661 A1 Feb. 26, 2015

Related U.S. Application Data

(60) Provisional application No. 61/869,561, filed on Aug. 23, 2013.

(30) Foreign Application Priority Data

Dec. 26, 2013 (TW) .............................. 102148369 A

(51) Int. Cl.
G06F 11/00 (2006.01)
G06F 11/10 (2006.01)
G11C 29/04 (2006.01)

(52) U.S. Cl.
CPC ......... *G06F 11/108* (2013.01); *G06F 11/1012* (2013.01); *G06F 11/1044* (2013.01); *G06F 11/1076* (2013.01); *G06F 2211/109* (2013.01); *G11C 2029/0411* (2013.01)

(58) Field of Classification Search
CPC ............. G06F 11/108; G06F 11/1076; G06F 2211/109; G06F 11/1044
See application file for complete search history.

(56) References Cited

U.S. PATENT DOCUMENTS 5,920,579 A * 7/1999 Nagai ................ G11B 20/1813
386/E5.036
5,991,911 A * 11/1999 Zook .................. G11B 20/1833
714/755

(Continued)

FOREIGN PATENT DOCUMENTS

JP 2006318461 A 11/2006
JP 2007-286813 A 11/2007

(Continued)

OTHER PUBLICATIONS

Office Action of corresponding KR application 10-2014-0109945, published on Dec. 1, 2015.

(Continued)

*Primary Examiner* — Charles Ehne
(74) *Attorney, Agent, or Firm* — Wang Law Firm, Inc.

(57) ABSTRACT

An embodiment of a method for accessing a storage unit of a flash memory, performed by a processing unit, includes at least the following steps. After a notification indicating that errors presented in a message of a sector within a RAID (Redundant Array of Independent Disk) group cannot be fixed by an error correction algorithm with a horizontal ECC (Error Correction Code) of the sector is received, addresses of the other sectors within the RAID group are determined. Information is provided to a sector-decoding unit and a RAID-decoding unit, which indicates that a vertical correction procedure has been activated. Storage-unit access interfaces are directed to read content from the determined addresses of the storage unit, thereby enabling the RAID-decoding unit to recover the message of the sector by using the read content.

14 Claims, 28 Drawing Sheets

(56) References Cited

U.S. PATENT DOCUMENTS

| | | |
|---|---|---|
| 7,136,986 B2 | 11/2006 | Han et al. |
| 7,221,589 B2 | 5/2007 | Li |
| 7,451,380 B2 | 11/2008 | Carnevale et al. |
| 7,617,368 B2 | 11/2009 | Van Dyke et al. |
| 7,783,957 B2 | 8/2010 | Carnevale et al. |
| 8,208,337 B2 | 6/2012 | Liao |
| 8,644,104 B2 | 2/2014 | Perego |
| 8,856,616 B1 | 10/2014 | Peleato-Inarrea et al. |
| 8,902,647 B1 | 12/2014 | Raghu et al. |
| 8,996,960 B1* | 3/2015 | Saxena ............... G06F 11/1048 714/773 |
| 2001/0054136 A1* | 12/2001 | Ninomiya ............ G06F 3/0601 712/1 |
| 2002/0161979 A1 | 10/2002 | Arimillie et al. |
| 2003/0023861 A1 | 1/2003 | Sako et al. |
| 2003/0145274 A1* | 7/2003 | Hwang ............. G11B 20/1833 714/799 |
| 2004/0193821 A1 | 9/2004 | Ruhovets |
| 2005/0195902 A1 | 9/2005 | Chung |
| 2008/0082897 A1 | 4/2008 | Brandman |
| 2008/0301519 A1 | 12/2008 | Kawabata |
| 2009/0006886 A1 | 1/2009 | O'Connor et al. |
| 2009/0198887 A1 | 8/2009 | Watanabe |
| 2009/0240873 A1* | 9/2009 | Yu ...................... G06F 3/0608 711/103 |
| 2009/0300233 A1 | 12/2009 | Jin et al. |
| 2010/0082854 A1 | 4/2010 | Rossen |
| 2011/0023033 A1 | 1/2011 | Memik |
| 2011/0153911 A1 | 6/2011 | Sprouse |
| 2013/0024608 A1 | 1/2013 | Hong et al. |
| 2013/0067144 A1 | 3/2013 | Namba et al. |
| 2013/0104002 A1 | 4/2013 | Hara et al. |
| 2013/0179753 A1* | 7/2013 | Flynn ................ G06F 12/0253 714/773 |
| 2013/0205183 A1 | 8/2013 | Fillingim et al. |
| 2013/0246887 A1 | 9/2013 | Torii et al. |
| 2013/0304967 A1 | 11/2013 | Hanafusa |
| 2014/0003142 A1 | 1/2014 | Lee et al. |
| 2014/0281599 A1 | 9/2014 | Grimsrud |
| 2015/0160999 A1 | 6/2015 | Seo et al. |
| 2015/0162087 A1 | 6/2015 | Raghu et al. |

FOREIGN PATENT DOCUMENTS

| | | |
|---|---|---|
| JP | 2009123191 A | 6/2009 |
| JP | 2009545062 A | 12/2009 |
| KR | 20030000017 A | 1/2003 |
| KR | 20030082376 A | 10/2003 |
| KR | 20070112224 A | 11/2007 |
| KR | 20090118031 A | 11/2009 |
| KR | 20120110672 A | 10/2012 |
| KR | 20130051909 A | 5/2013 |
| TW | 200919171 A1 | 5/2009 |
| TW | 200921384 A | 5/2009 |
| TW | 201250690 A | 12/2012 |
| TW | 201317779 A1 | 5/2013 |

OTHER PUBLICATIONS

Office Action of corresponding KR application 10-2014-0109942, published on Dec. 1, 2015.
Office Action of corresponding TW application 102148368, published on Dec. 24, 2015.
Office Action of corresponding TW application 102148610, published on Dec. 31, 2015.
Office Action of partner U.S. Appl. No. 14/331,591, published on Dec. 31, 2015.
Office Action of partner U.S. Appl. No. 14/330,866, published on Jan. 5, 2016.
Office Action of co-pending U.S. Appl. No. 14/330,853, published on Feb. 2, 2016.
Office Action of corresponding TW application, published on Aug. 27, 2015.
Office Action of corresponding TW application, published on Jun. 25, 2015.
Office Action of corresponding TW application, published on Jul. 21, 2015.
Office Action of corresponding KR application 10-2014-0109943, published on Oct. 1, 2015.
Office Action of corresponding KR application 10-2014-0109944, published on Oct. 1, 2015.
Office Action of co-pending U.S. Appl. No. 14/331,575, published on Mar. 24, 2016.
Office Action of corresponding KR application, published on Jul. 15, 2016.

\* cited by examiner

| 510[0][0][0] | 530[0][0][0] | 410[0][0][0] |
| 510[1][0][0] | 530[1][0][0] | 410[1][0][0] |
| ≈ | ≈ | |
| 510[j][0][0] | 530[j][0][0] | 410[j][0][0] |
| 510[0][1][0] | 530[0][1][0] | 410[0][1][0] |
| ≈ | ≈ | |
| 510[0][i][0] | 530[0][i][0] | 410[0][i][0] |
| ≈ | ≈ | |
| 510[j][i][0] | 530[j][i][0] | 410[j][i][0] |

FIG. 5B

|      |  |  |  | ⟵1300 |
|------|-----|------|------|------|
| WL0  | PG0 | PG1  | PG2  |      |
| WL1  | PG3 | PG4  | PG5  |      |
| WL2  | PG6 | PG7  | PG8  |      |
| WL3  | PG9 | PG10 | PG11 |      |

.......

| WL63 | PG189 | PG190 | PG191 |

|  | First Time | Second Time | Third Time |
|---|---|---|---|
| WL0 | 1 | 3 | 6 |
| WL1 | 2 | 5 | 9 |
| WL2 | 4 | 8 | 12 |
| WL3 | 7 | 11 | 15 |
| WL4 | 10 | 14 | 18 |
| WL5 | 13 | 17 | 21 |
| ⋮ | ⋮ | ⋮ | ⋮ |
| WL61 | 181 | 185 | 189 |
| WL62 | 184 | 188 | 191 |
| WL63 | 187 | 190 | 192 |

FIG. 21

METHODS FOR ACCESSING A STORAGE UNIT OF A FLASH MEMORY AND APPARATUSES USING THE SAME

CROSS REFERENCE TO RELATED APPLICATIONS

This application is a non-provisional of U.S. Provisional Application No. 61/869,561, filed Aug. 23, 2013, the entirety of which is incorporated by reference herein. This Application claims priority of Taiwan Patent Application No. 102148369, filed on Dec. 26, 2013, the entirety of which is incorporated by reference herein.

BACKGROUND

1. Technical Field

The present invention relates to flash memory, and in particular to methods for accessing a storage unit of a flash memory and apparatuses using the same.

2. Description of the Related Art

Memory cells of a flash memory may malfunction after numerous accesses. Particles or mask defects in manufacturing a flash memory may cause a failure of a whole column of a storage unit, or even worse, a whole storage unit of the flash memory to be accessed. Accordingly, what is needed are methods for accessing a storage unit of a flash memory to protect data stored therein when the aforementioned problem appears, and apparatuses using the methods.

BRIEF SUMMARY

An embodiment of a method for accessing a storage unit of a flash memory, performed by a processing unit, is disclosed to include at least the following steps. After a notification indicating that errors presented in a message of a sector within a RAID (Redundant Array of Independent Disk) group cannot be fixed by an error correction algorithm with a horizontal ECC (Error Correction Code) of the sector is received, addresses of the other sectors within the RAID group are determined Information is provided to a sector-decoding unit and a RAID-decoding unit, which indicates that a vertical correction procedure has been activated. Storage-unit access interfaces are directed to read content from the determined addresses of the storage unit, thereby enabling the RAID-decoding unit to recover the message of the sector by using the read content.

An apparatus for accessing a storage unit of a flash memory is introduced to include at least a sector-decoding unit, a RAID-decoding unit and a processing unit. The processing unit, coupled to the sector-decoding unit and the RAID-decoding unit, after receiving a notification indicating that errors presented in a message of a sector within a RAID group cannot be fixed by an error correction algorithm with a horizontal ECC of the sector, determines addresses of the other sectors within the RAID group. The processing unit further provides information to the sector-decoding unit and the RAID-decoding unit, which indicates that a vertical correction procedure has been activated, and directs storage-unit access interfaces to read content from the determined addresses of the storage unit, thereby enabling the RAID-decoding unit to recover the message of the sector by using the read content.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein:

FIG. 5B is a schematic diagram showing a logical view of two-dimensional ECC according to an embodiment of the invention;

FIG. 13 is a schematic diagram showing a TLC block of a storage unit according to an embodiment of the invention;

FIG. 21 is a schematic diagram depicting a programming sequence for wordlines of a storage unit according to an embodiment of the invention.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
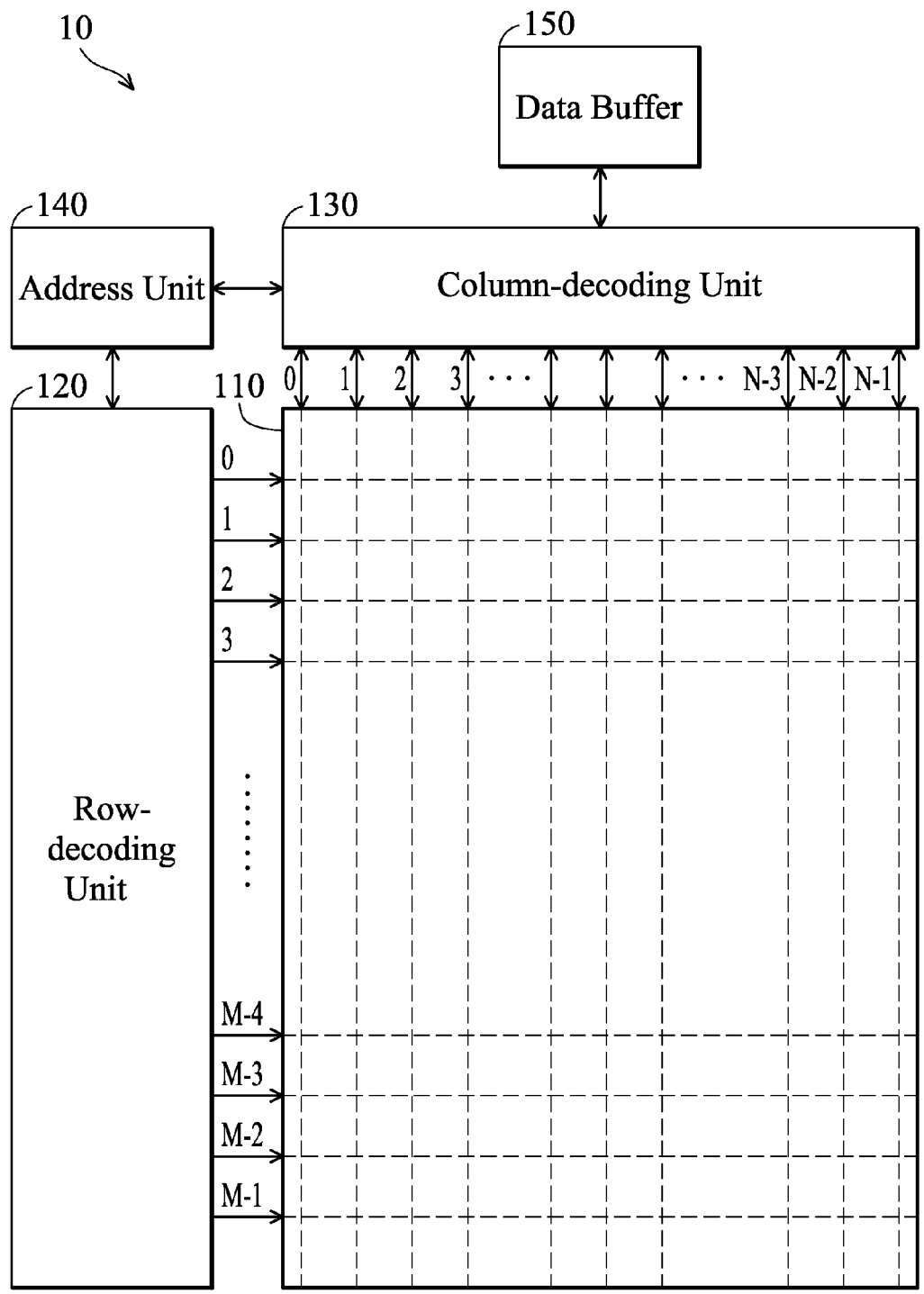
FIG. 1 shows a schematic diagram depicting a storage unit of a flash memory according to an embodiment of the invention.

Embodiments of the invention introduce methods for accessing a storage unit of a flash memory and apparatuses using the same to encode data to be stored into the storage unit and decode the encoded data from the storage unit. FIG. 1 shows a schematic diagram depicting a storage unit of a flash memory according to an embodiment of the invention. A storage unit 10 includes an array composed of M×N memory cells, and each memory cell may store at least one bit of information. The flash memory may be a NOR or NAND flash memory, etc. In order to appropriately access desired information, a row-decoding unit 120 is used to select appropriate row lines for access. Similarly, a column-decoding unit 130 is employed to select an appropriate number of bytes within the row for output. An address unit 140 applies row information to the row-decoding unit 120 defining which of the N rows of the memory cell array 110 is to be selected for reading or writing. Similarly, the column-decoding unit 130 receives address information defining which one or ones of the M columns of the memory cell array 110 are to be selected. Rows may be referred to as wordlines by those skilled in the art interchangeably, and columns may be referred to as bitlines interchangeably. Data read from or to be applied to the memory cell array 110 is stored in a data buffer 150. Memory cells may be SLCs (Single-Level Cells), MLCs (Multi-Level Cells) or TLCs (Triple-Level Cells).

Figure 16A:
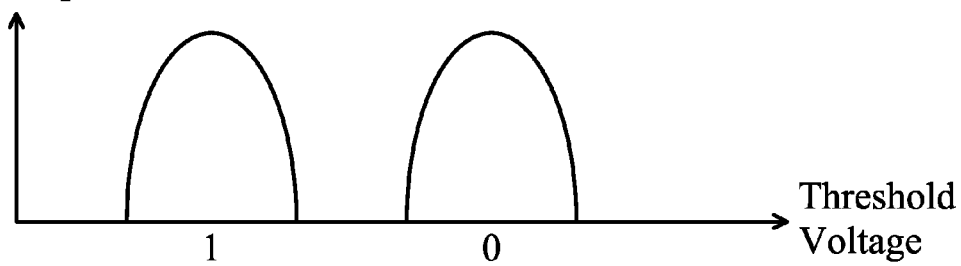
FIG. 16A is a schematic diagram illustrating a distribution of the threshold voltages of a large population of SLC cells according to an embodiment of the invention.

In an SLC, one state has zero charge in the floating gate and is the unwritten state of the cell after being erased (commonly represented by the "1" state) and the other state has some amount of negative charge in the floating gate (commonly represented by the "0" state). Having negative charge in the gate causes the threshold voltage of the transistor of the cell (i.e. the voltage that has to be applied to the control gate of the transistor in order to cause the transistor to conduct) to increase. It is feasible to read the stored bit by checking the threshold voltage of the cell. If the threshold voltage is in the higher state then the bit value is "0", and if the threshold voltage is in the lower state then the bit value is "1". FIG. 16A is a schematic diagram illustrating a distribution of the threshold voltages of a large population of SLC cells according to an embodiment of the invention. Because the memory cells in a flash memory are not exactly identical in their characteristics and behavior (due to, for example, small variations in impurity concentrations or defects in the silicon structure), applying the same programming operation to all of the memory cells does not cause all of the memory cells to have exactly the same threshold voltage. Instead, the threshold voltage is distributed as shown in FIG. 16A. SLCs storing a value of "1" typically have a negative threshold voltage, such that most of the cells have a threshold voltage close to the central voltage value of the left peak, with fewer cells having threshold voltages lower or higher than the central voltage of the left peak. Similarly, SLCs storing a value of "0" typically have a positive threshold voltage, such that most of the cells have a threshold voltage close to the central voltage of the right peak, with fewer cells having threshold voltages lower or higher than the central voltage of the right peak.

Figure 16B:
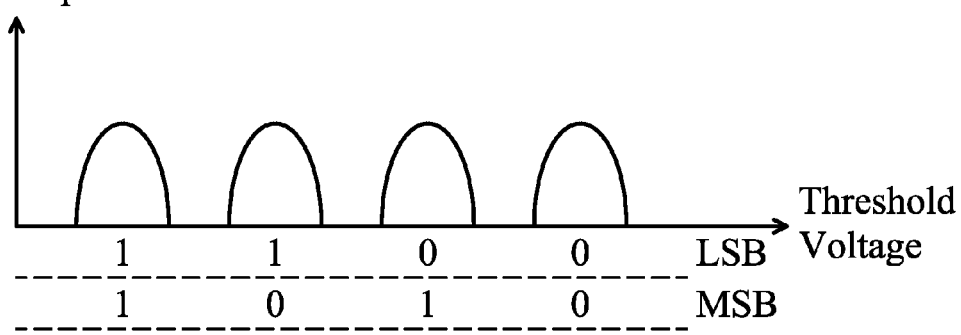
FIG. 16B is a schematic diagram illustrating a distribution of the threshold voltages of a large population of MLC cells according to an embodiment of the invention.
Figure 16C:
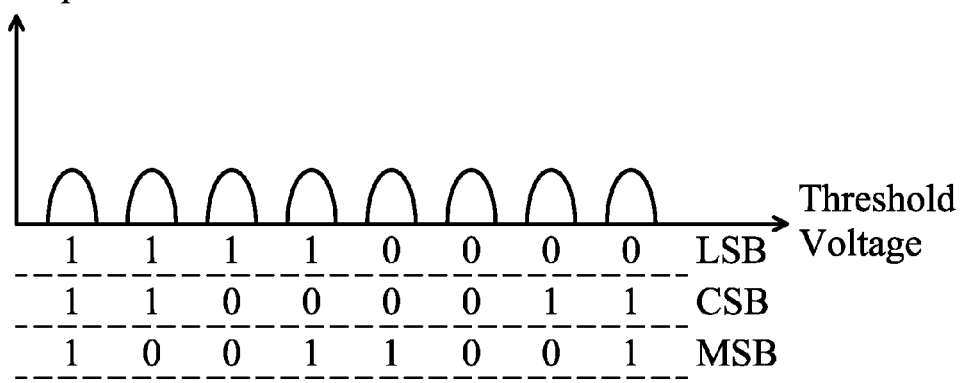
FIG. 16C is a schematic diagram illustrating a distribution of the threshold voltages of a large population of TLC cells according to an embodiment of the invention.

Although an MLC literally has more than two levels, i.e. more than one bit per cell, the most common MLC at present are ones with two bits per cell, and therefore examples are given below. A single MLC storing two bits of information is in one of four different states, where one bit is designated as the LSB (Least Significant Bit) and the other is designated as the MSB (Most Significant Bit). As the "state" of a memory cell is represented by its threshold voltage, an MLC supports four different valid ranges for its threshold voltages. FIG. 16B is a schematic diagram illustrating a distribution of the threshold voltages of a large population of MLC cells according to an embodiment of the invention. As expected, it has four peaks, each peak corresponding to one state. Similarly, a single TLC cell storing three bits of information is in one of eight different states, where the three bits are designated as the LSB, CSB (Center Significant Bit) and MSB, respectively. A single TLC supports eight different valid ranges for its threshold voltages. FIG. 16C is a schematic diagram illustrating a distribution of the threshold voltages of a large population of TLC cells according to an embodiment of the invention. As expected, it has eight peaks, each peak corresponding to one state. It should be understood, however, that the present invention is equally applicable to flash memory devices that support more than three bits per memory cell.

Figure 2:
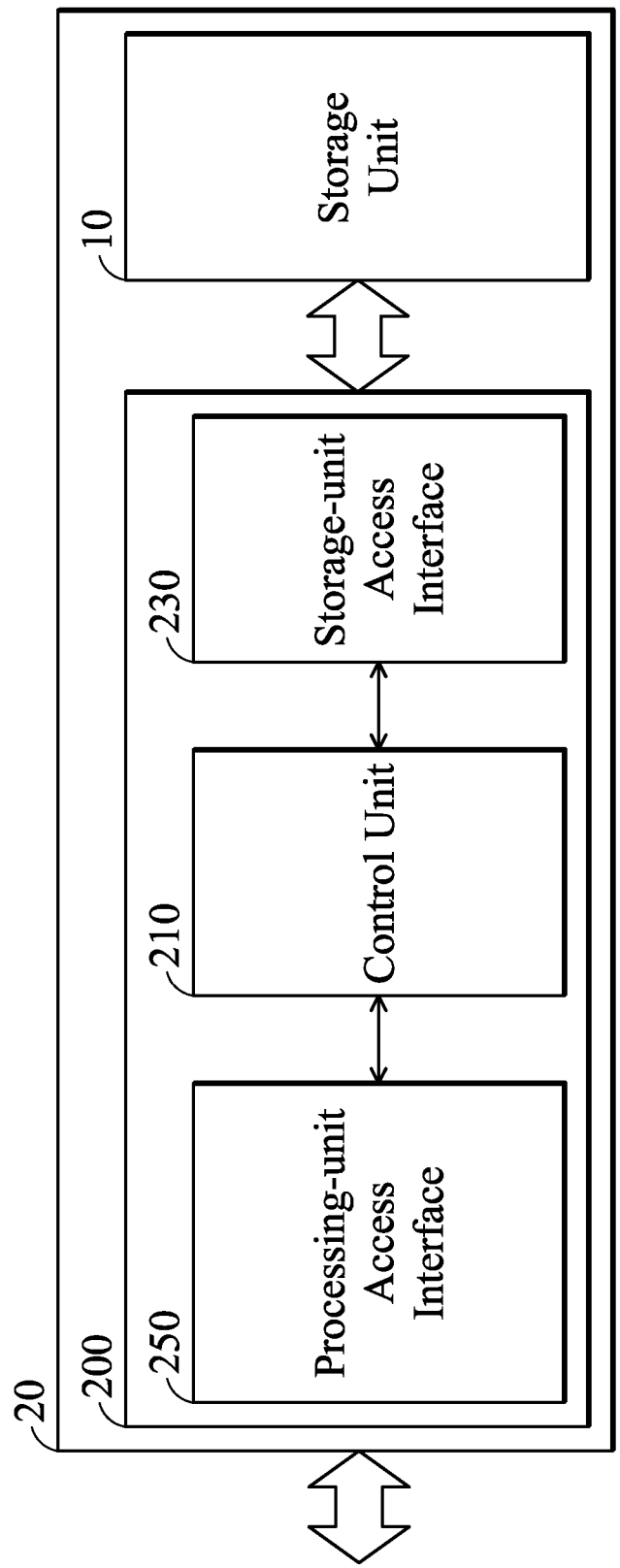
FIG. 2 is the system architecture of a flash memory according to an embodiment of the invention.

FIG. 2 is the system architecture of a flash memory according to an embodiment of the invention. The system architecture 20 of the flash memory contains a controller 200 being configured to write data into a designated address of the storage unit 10, and read data from a designated address thereof. Specifically, a control unit 210 writes data into a designated address of the storage unit 10 through a storage-unit access interface 230 and reads data from a designated address thereof through the same interface 230. The system architecture 20 uses several electrical signals for coordinating commands and data transfer between the controller 200 and the storage unit 10, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The storage-unit access interface 230 may communicate with the storage unit 10 using a SDR (Single Data Rate) protocol or a DDR (Double Data Rate) protocol, such as ONFI (open NAND flash interface), DDR toggle, or others. The control unit 210 may communicate with other electronic devices through a processing-unit access interface 250 using a standard protocol, such as USB (Universal Serial Bus), ATA (Advanced Technology Attachment), SATA (Serial ATA), PCI-E (Peripheral Component Interconnect Express) or others.

Figure 3:
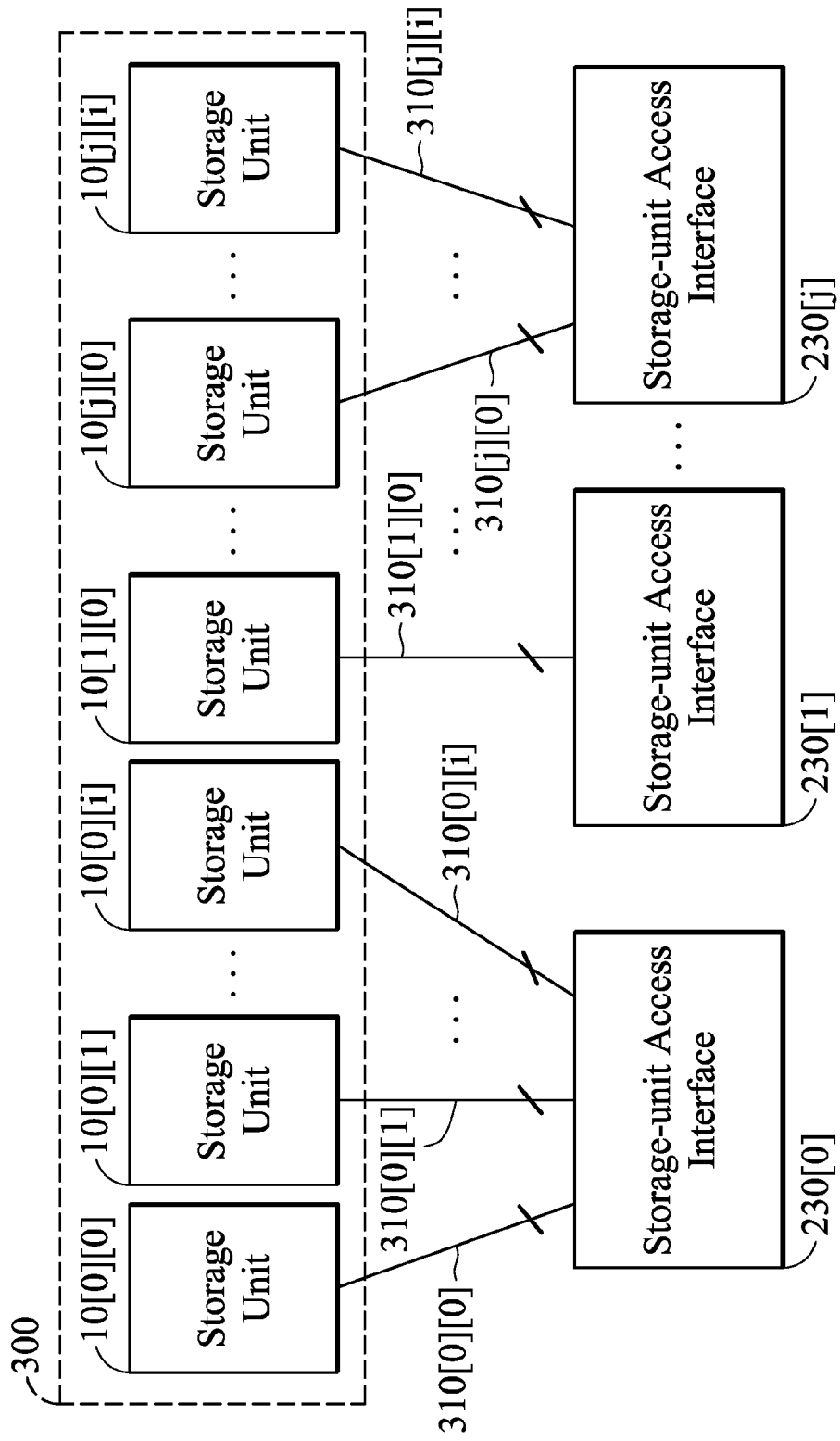
FIG. 3 is a schematic diagram illustrating interfaces to storage units of a flash storage according to an embodiment of the invention.

A flash storage may contain multiple storage units 10 and each storage unit may be practiced in a single die and have an independent or shared interface to communicate with the storage-unit access interface 230. The access operations of mass data to or from the storage units, such as programming data thereto, reading data therefrom, etc., may be pipelined to improve the efficiency. FIG. 3 is a schematic diagram illustrating interfaces to storage units of a flash storage according to an embodiment of the invention. A flash storage 300 may provide j+1 channels and each channel is associated with i+1 storage units. That is, i+1 storage units may share the same channel to communicate with a control unit. For example, assume that 8 channels (j=7) are provided by the flash storage 300 and each channel is associated with 8 storage units (i=7): The flash storage 300 has 64 storage units 10[0 . . . j][0 . . . i] in total. A control unit of a controller may use one set of the electrical signals 310[0 . . . j][0 . . . 1] provided by the flash storage 300 to program data into a designated storage unit and/or read data from the designated storage unit. It should be noted that each storage unit owns an independent CE control signal and storage units in the same channel may share data lines, clock signal and other control signal lines. That is, the control unit is required to activate a corresponding CE control signal when attempting to perform data access to a designated storage unit via an associated storage-unit access interface (or the so-called channel). It is apparent that any number of channels may be provide in the flash storage 300, and each channel may be associated with any number of storage units, and the invention should not be limited thereto.

Figure 4:
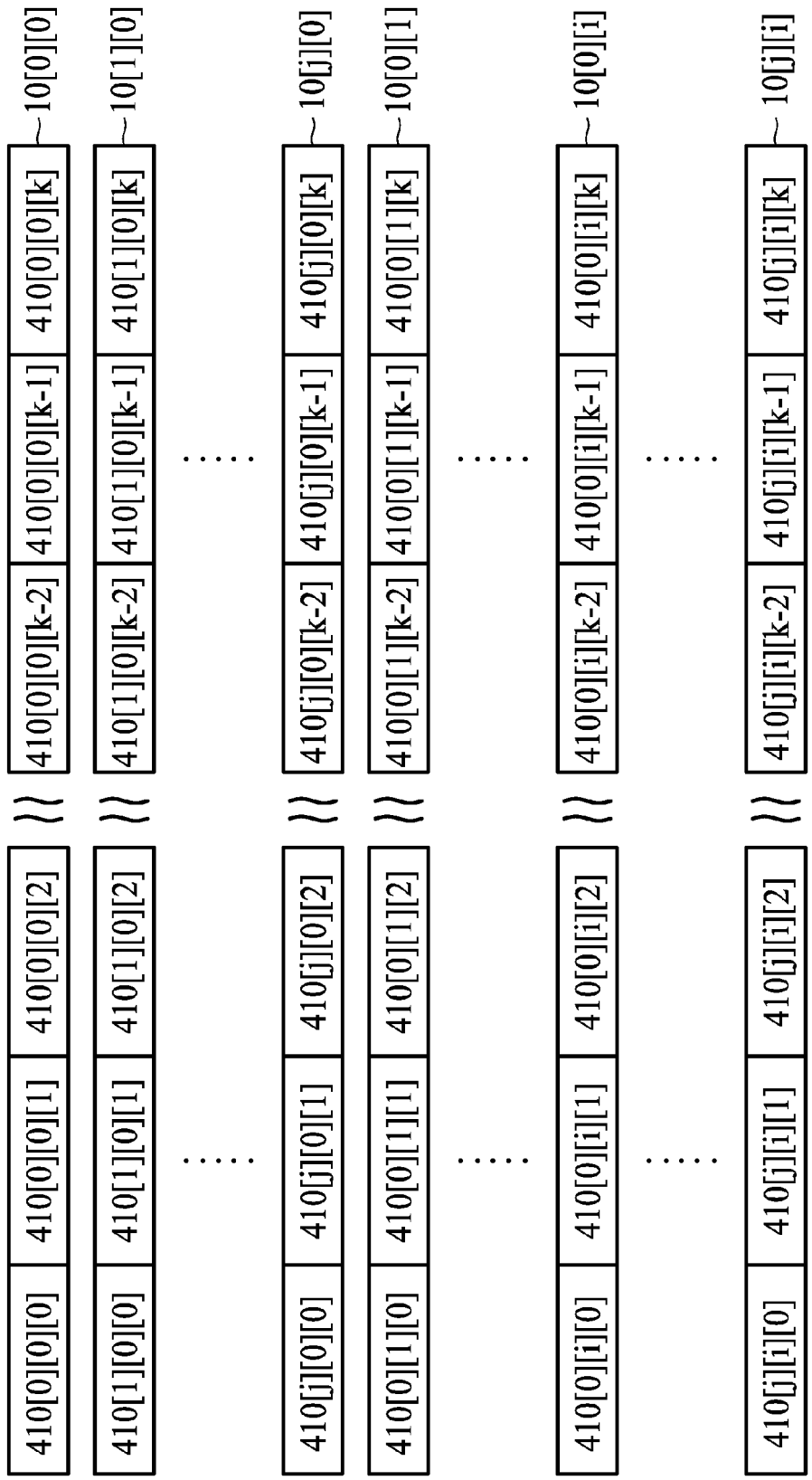
FIG. 4 is a schematic diagram showing a logical view of data storage according to an embodiment of the invention.
Figure 5A:
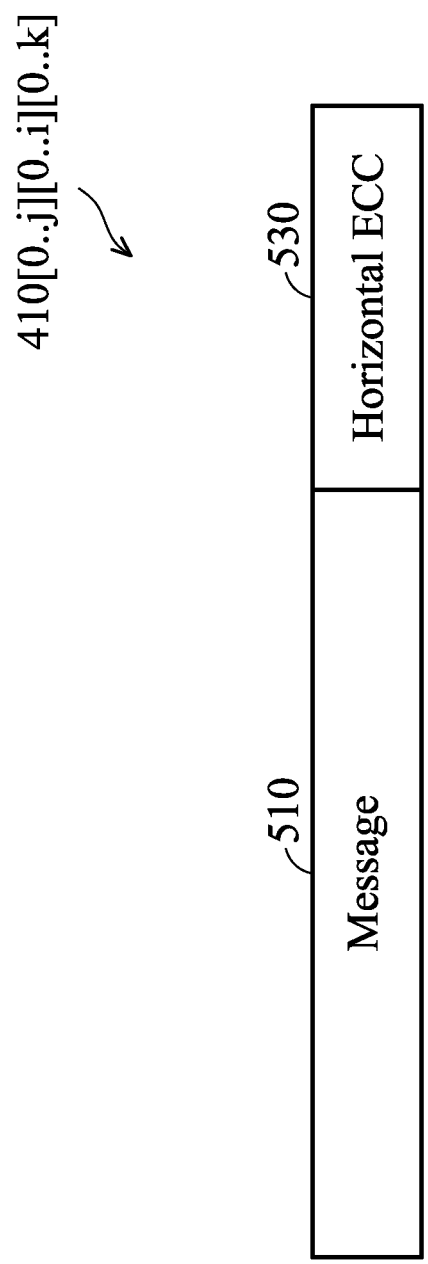
FIG. 5A is a schematic diagram showing a logical view of data storage applied in each sector according to an embodiment of the invention.

A two-dimensional ECC (Error Correction Code) may be appended to the stored messages, so as to guarantee the accuracy of the messages. FIG. 4 is a schematic diagram showing a logical view of data storage according to an embodiment of the invention. The (j+1)×(i+1) storage units may include l storage units for storing ECCs (so-called vertical ECCs). Each vertical ECC is generated according to values stored in corresponding addresses of the other (j+1)×(i+1)−l storage units. In an example, assume i=7, j=7 and l=1: The last storage unit 10[7][7] may store the SPC(64, 63) code, where SPC is the abbreviation of single parity check. In another example, assume i=7, j=7 and l=2: The last two storage units 10[7][6] and 10[7][7] may store the RS(64, 62) code, where RS stands for the Reed-Solomon code. In the other example, assume i=7, j=7 and l=3: The last three storage units 10[7][5], 10[7][6] and 10[7][7] may store the RS(64, 61) code. The above examples are not exhaustive, and it should be understood that other types of ECC can be treated as a vertical ECC. The vertical ECC provides the protection in the storage-unit level, that is, when one of the storage units malfunctions, the vertical ECC accompanied by values stored in the other regular storage units can be used to fix all values stored in the failed storage unit if a total number of errors in the regular storage units are able to be fixed. In addition to the messages, which are received via the processing-unit access interface 250, the other storage units stores horizontal ECCs. Every wordline in each storage unit may store values of k+1 (e.g. k=31) sectors. The aforementioned sectors stored in a single wordline may be collectively referred to as a page. For example, for a designated wordline, the storage unit 10[0][0] may store values of sectors 410[0][0][0] to 410[0][0][k], the storage unit 10[0][i] may store values of sectors 410[0][i][0] to 410[0][i//k], and the storage unit 10[j//i] may store values of sectors 410[j//i][0] to 410[j//i][k]. Each of the exemplary sectors 410[0][0][0] to 410[0][0][k], 410[0][i][0] to 410[0][i//k], 410[j//i][0] to 410[j//i][k], and the like, may be referred to as a CE sector. FIG. 5A is a schematic diagram showing a logical view of data storage applied in each sector according to an embodiment of the invention. Any of the sectors 410[0 . . . j][0 . . . i][0 . . . k] may contain a message 510 and a horizontal ECC 530. The length of the message 510 is fixed, such as 1K bytes. The horizontal ECC 530 is generated in light of the values stored in the message 510, and may be a SPC code, a RS code, or a similar but different code utilized to correct tolerable errors presented in the message 510. The horizontal ECC 530 provides the protection in the sector level, that is, when a tolerable number of errors occur in the message 510, the horizontal ECC 530 accompanied by the other correct values stored in the same message 510 can be used to fix the errors. FIG. 5B is a schematic diagram showing a logical view of two-dimensional ECC according to an embodiment of the invention. Each sector contains at least a message and a horizontal ECC, for example, 410[0][0][0] contains at least a message 510[0][0][0] and a horizontal ECC 530[0][0][0] employed to fix errors presented in the message 510[0][0][0]. Assume l=1, that is, only one storage unit is utilized to store vertical ECCs: A sector 510[j//i][0] stores a vertical ECC employed to fix error bits presented in messages 510[0][0][0] to 510[j−1//i][0] while s sector 530[j//i][0] stores a vertical ECC employed to fix error bits presented in horizontal ECCs 530[0][0][0] to 530[j−1//i][0]. In cases where a sector contains too many errors to recover although a typical error correction algorithm is used with a corresponding horizontal ECC, or hardware failure has occurred, a typical error correction algorithm is used accompanying with the vertical ECC and the other messages in relevant sectors, so as to recover the message of this sector. The aforementioned sectors and vertical ECC employed to correct values presented in the sectors may be collectively referred to as a RAID (Redundant Array of Independent Disk) group.

Figure 6:
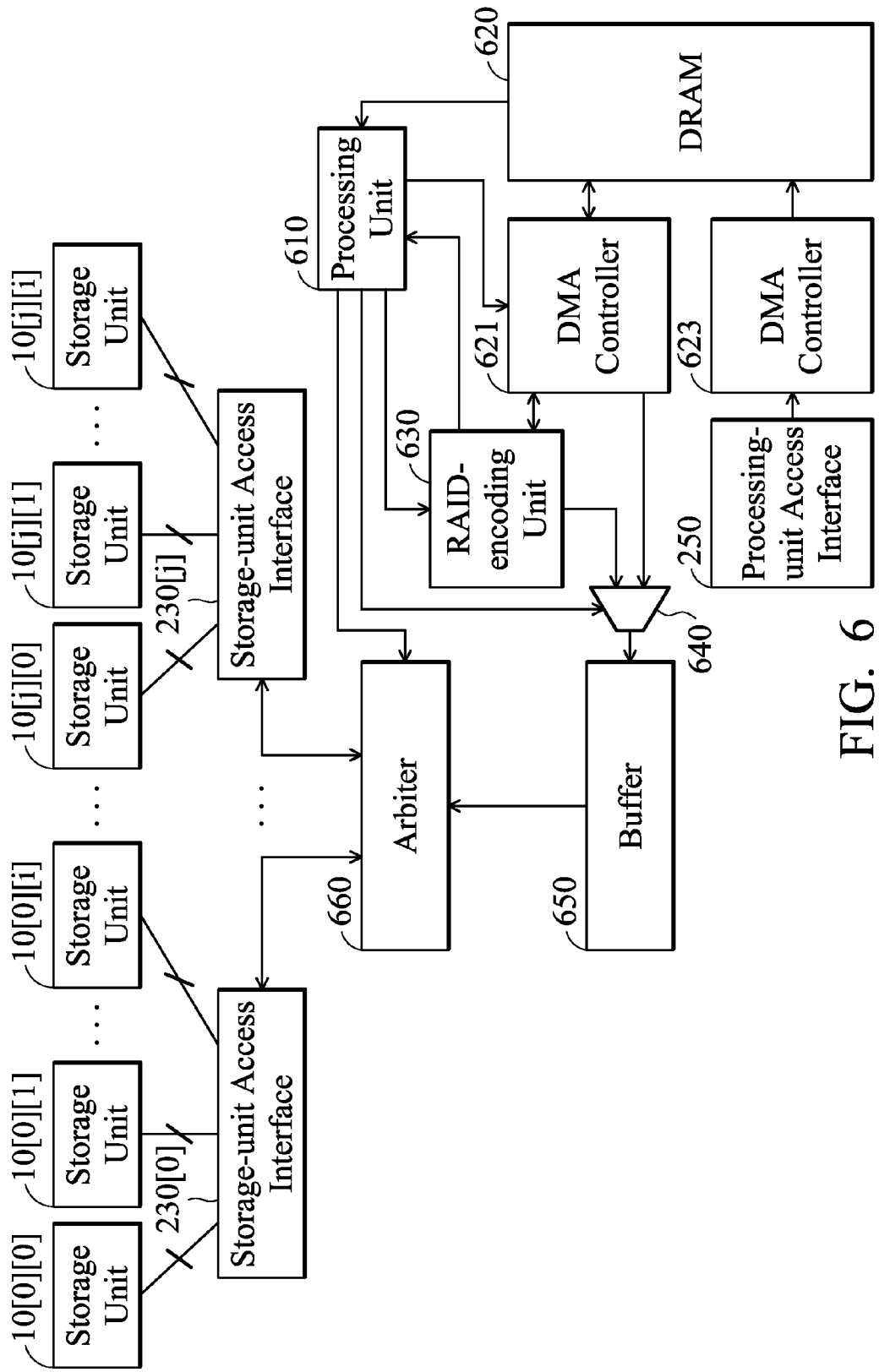
FIG. 6 is a system block diagram for programming data according to an embodiment of the invention.

FIG. 6 is a system block diagram for programming data according to an embodiment of the invention. The processing unit 610 may be implemented in numerous ways, such as with dedicated hardware, or with general-purpose hardware (e.g., a single processor, multiple processors or graphics processing units capable of parallel computations, or others) that is programmed using microcode or software instructions to perform the functions recited herein. A message desired to be written and received from another electronic device via the processing-unit access interface 250 is stored to a DRAM (Dynamic Random Access Memory) 620 by a DMA (Direct Memory Access) controller 623. Any of the storage units 10[0][0] to 10[j//i] may contain multiple SLC. A multiplexer 640 may default to couple the DRAM 620 and a buffer 640. After detecting that a specified length of message, such as 32K bytes, has been stored in the DRAM 620, the processing unit 610 directs the DMA controller 621 to store the message in the DRAM 620 into the buffer 650 through the multiplexer 630, and into a buffer (not shown) of a RAID-encoding unit 630 simultaneously. The RAID-encoding unit 630 may employ any typical ECC encoding algorithm to generate the vertical ECC, such as the SPC(64,63), RS(64,62) or RS(64,61) code, or a similar but different code, according to the currently stored result and the newly received message. The processing unit 610 may include at least two counters, one is a message counter for calculating a total number of message outputs, and the other is an ECC counter for calculating a total number of vertical ECC outputs. The processing unit 610 controls the multiplexer 640 to couple the RAID-encoding unit 630 to the buffer 650, and directs the RAID-encoding unit 630 to output the encoded vertical ECC to the buffer 650 in one or more batches when the message counter has reached a predefined threshold. The processing unit 610 controls the multiplexer 640 to couple the DRAM 620 back to the buffer 650 again, so as to continue the subsequent message storage when the ECC counter has reached a predefined threshold. For example, assume that the RS(64,61) is employed: The processing unit 610 controls the multiplexer 640 to couple the RAID-encoding unit 630 to the buffer 650 and resets the message counter to zero when the message counter has counted to 61. Then, the processing unit 610 controls the multiplexer 640 to couple the DRAM 620 to the buffer 650 and resets the ECC counter to zero when the ECC counter has counted to 3. An arbiter 660 is directed by the processing unit 610 to read values of a sector or a vertical ECC from the buffer 650 and write the values into a designated storage unit, such as one of the storage units 10[0][0] to 10[$j$//$i$], through the associated storage-unit access interface, such as the associated one of the storage-unit access interfaces 230[0] to 230[$j$] each time the data stored in the DRAM 620 or the RAID-encoding unit 630 has been outputted to the buffer 650. The arbiter 660 may activate a CE control signal relevant to the designated storage unit, and transmit the values and addresses to the designated storage unit via the data lines of the associated storage-unit access interface. Every storage-unit access interface further includes horizontal ECC circuits capable of generating horizontal ECCs according to the values (may be of a message or a vertical ECC) read from the buffer 650. Specifically, for example, the storage-unit access interface generates a horizontal ECC 530 accordingly after a specified length of message 510 has been read from the buffer 650, such as 1K bytes. The storage-unit access interface then programs the message 510 and the generated horizontal ECC 530 to a designated address of a designated storage unit.

Figure 7A:
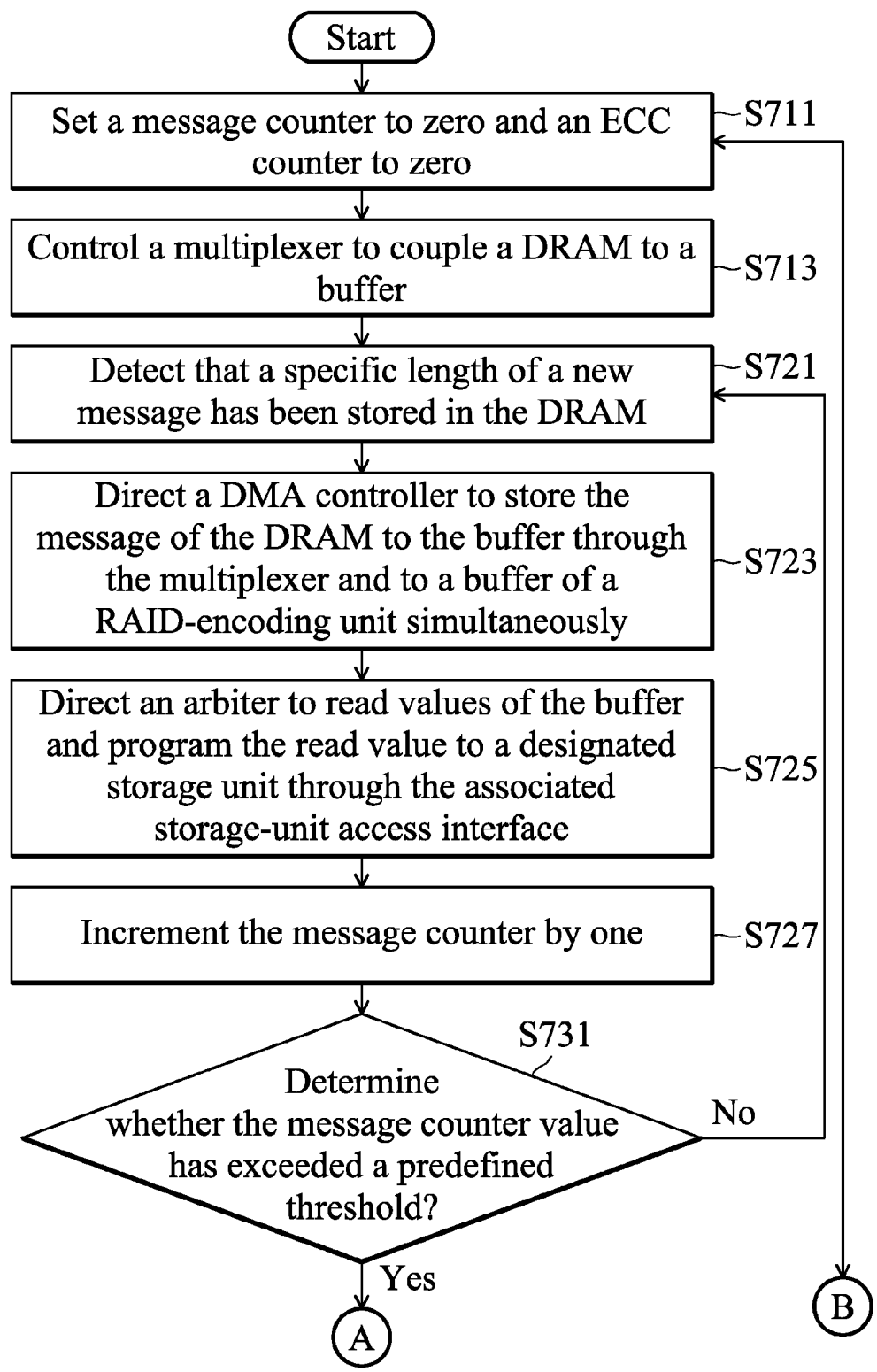
FIGS. 7A and 7B are flowcharts illustrating a method for programming data, performed by a processing unit, according to an embodiment of the invention.
Figure 7B:
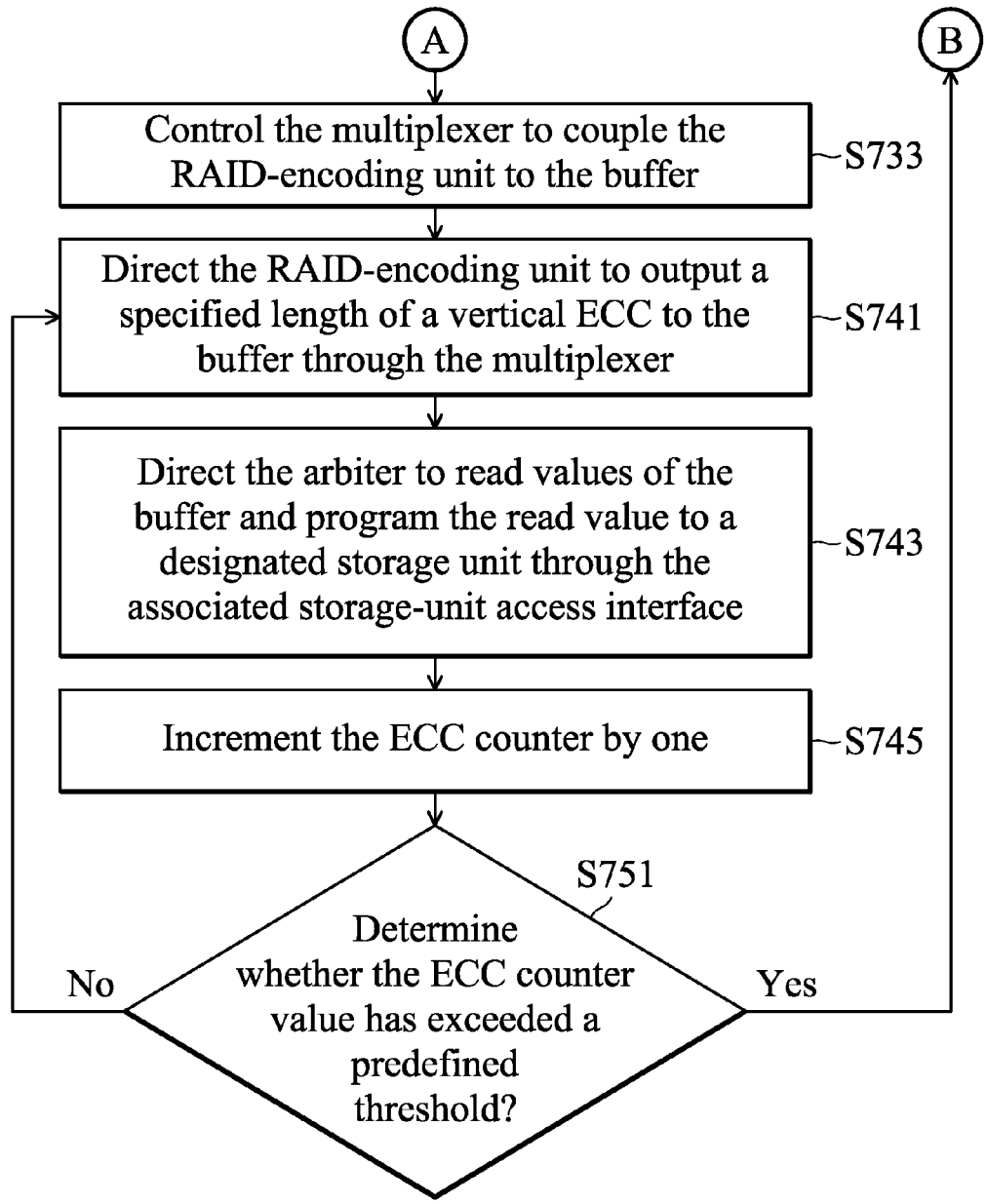

FIGS. 7A and 7B are flowcharts illustrating a method for programming data, performed by a processing unit, according to an embodiment of the invention. In order to form a RAID group, the processing unit 610 begins to set a message counter to zero and an ECC counter to zero for programming data (step S711), and control the multiplexer 640 to couple the DRAM 620 to the buffer 650 (step S713). Next, a loop including steps S721 to S731 is repeatedly performed until all messages within the RAID group are completely programmed into designated storage units, such as storage units 10[0][0] to 10[$j$//$i$]. Specifically, after detecting that a specific length of a new message, such as 32K bytes, has been stored in the DRAM 620 (step S721), the processing unit 610 directs the DMA controller 621 to store the message of the DRAM 620 to the buffer 650 through the multiplexer 640, and to the buffer (not shown) of the RAID-encoding unit 630 simultaneously (step S723). Following that, the processing unit 610 directs the arbiter 660 to read values of the buffer 650 and program the read value to a designated storage unit, such as one of the storage units 10[0][0] to 10[$j$//$i$], through the associated storage-unit access interface, such as the associated one of the storage-unit access interfaces 230[0] to 230[$j$] (step S725). After incrementing the message counter by one (step S727), the processing unit 610 determines whether the message counter value has exceeded a predefined threshold, such as (j+1)×(i+1)−l−1 (step S731). If so, the process continues to perform the following steps S733 to S751 for programming one or more vertical ECCs within the RAID group; otherwise, the process loops back to step S721 for programming un-finished messages within the RAID group.

Detailed programming of the vertical ECC(s) within the RAID group is illustrated as follows. The processing unit 610 controls the multiplexer 640 to couple the RAID-encoding unit 630 to the buffer 650 (step S733). Next, a loop including steps S741 to S751 is performed repeatedly until all vertical ECC(s) within the RAID group is/are completely programmed into designated storage unit(s), such as the storage units 10[$j$//$i$−$l$+1] to 10[$j$//$i$]. Specifically, the processing unit 610 directs the RAID-encoding unit 630 to output a specified length of a vertical ECC, such as 32K bytes, to the buffer 650 through the multiplexer 640 (step S741). Following that, the processing unit 610 directs the arbiter 660 to read values of the buffer 650 and program the read value to a designated storage unit, such as one of the storage units 10[$j$//$i$−$l$+1] to 10[$j$//$i$], through the associated storage-unit access interface, such as the associated storage-unit access interface 230[$j$] (step S743). After incrementing the ECC counter by one (step S745), the processing unit 610 determines whether the ECC counter value has exceeded a predefined threshold, such as l−1 (step S751). If so, the process reverts back to step S711 to continue programming for the next RAID group; otherwise, the process loops back to step S741 for programming un-finished vertical ECC(s) within the RAID group.

Figure 8:
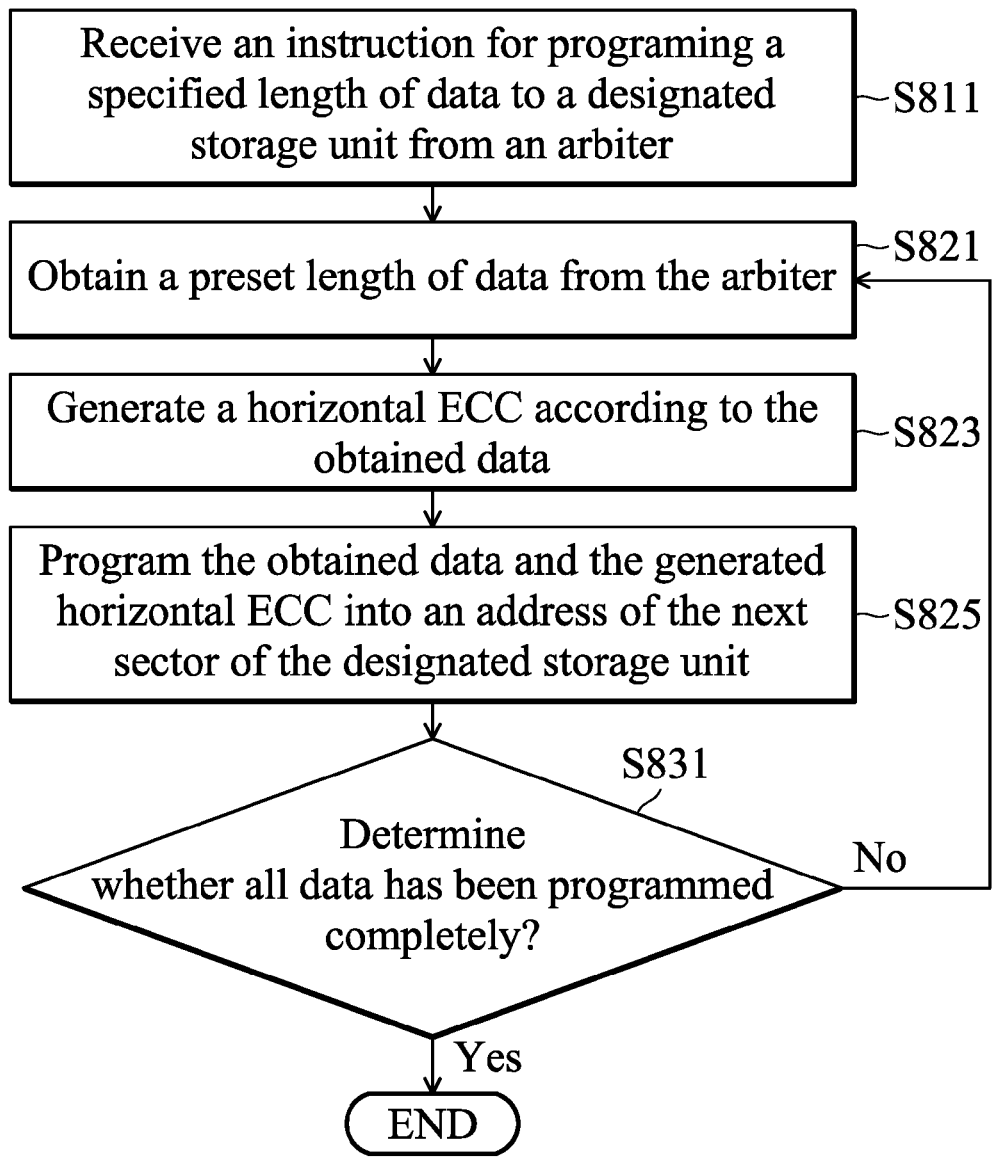
FIG. 8 is a flowchart illustrating a method for programming data, performed by a storage-unit access interface, according to an embodiment of the invention.
Figure 19A:
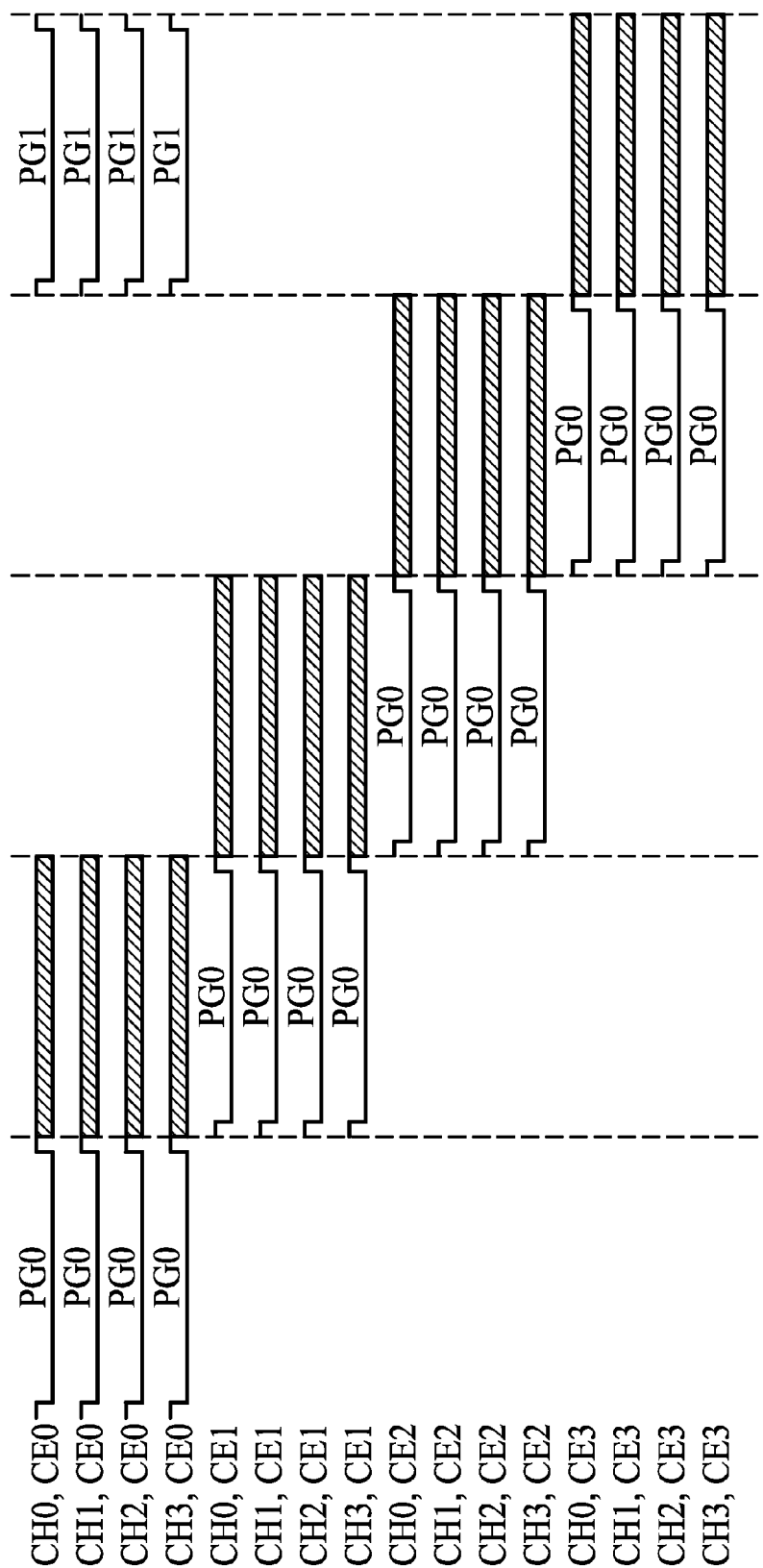
FIG. 19A illustrates an example of programming a data page including messages, horizontal ECCs, and/or vertical ECCs into wordlines of storage units.

FIG. 8 is a flowchart illustrating a method for programming data, performed by a storage-unit access interface, according to an embodiment of the invention. The method may be applied in one of the storage-unit access interfaces 230[0] to 230[$j$]. After the storage-unit access interface receives an instruction for programming a specified length of data, such as a 32K-byte message, to a designated storage unit from the arbiter 660 (step S811), a loop including steps S821 to S831 is repeatedly performed until all data is completely programmed Specifically, for each run of the data programming, the storage-unit access interface obtains a preset length of data, such as 1K bytes, from the arbiter 660 (step S821), generates a horizontal ECC according to the obtained data (step S823), and programs the obtained data and the generated horizontal ECC into an address of the next sector of the designated storage unit (step S825). It should be understood that, in step S825, if it is the first run of programming, then the read data and the generated horizontal ECC are programmed into an address of the first sector of a designated wordline. Next, the storage-unit access interface determines whether all data has been programmed completely (step S831). If so, the process ends; otherwise, it reverts back to step S821 to perform the next run of programming FIG. 19A is a timing diagram for programming data according to an embodiment of the invention. The storage-unit access interfaces 230[0] to 230[3] are denoted as channels CH0 to CH3 respectively, and storage units associated with each storage-unit access interface are denoted as CE0 to CE3 respectively. FIG. 19A illustrates an example of programming a data page PG0 including messages, horizontal ECCs, and/or vertical ECCs into the first wordlines WL0 of the storage units 10[0][0] to 10[3][3]. The arbiter 660 transmits relevant portions of the data page PG0 to buffers (not shown) of the first connected storage units CE0 via the channels CH0 to CH3, respectively, and then, issues data write commands to the connected storage units CE0, so as to start the physical data programming. The storage unit CE0 enters the busy state for a time period to program the data page PG0 stored in the buffer into SLCs on the wordline WL0 after receiving the data write command. When the storage units CE0 perform the physical data programming, the channels CH0 to CH3 are available and the arbiter 660 can employ the channels CH0 to CH3 to transmit relevant portions of the data page PG0 to buffers (not shown) of the second connected storage units CE1. Those skilled in the art may observe that the aforementioned data placement for a RAID group results in the reduction of spare time on the channels CH0 to CH3 and yields better data throughput in the transmission to the storage units.

Figure 9:
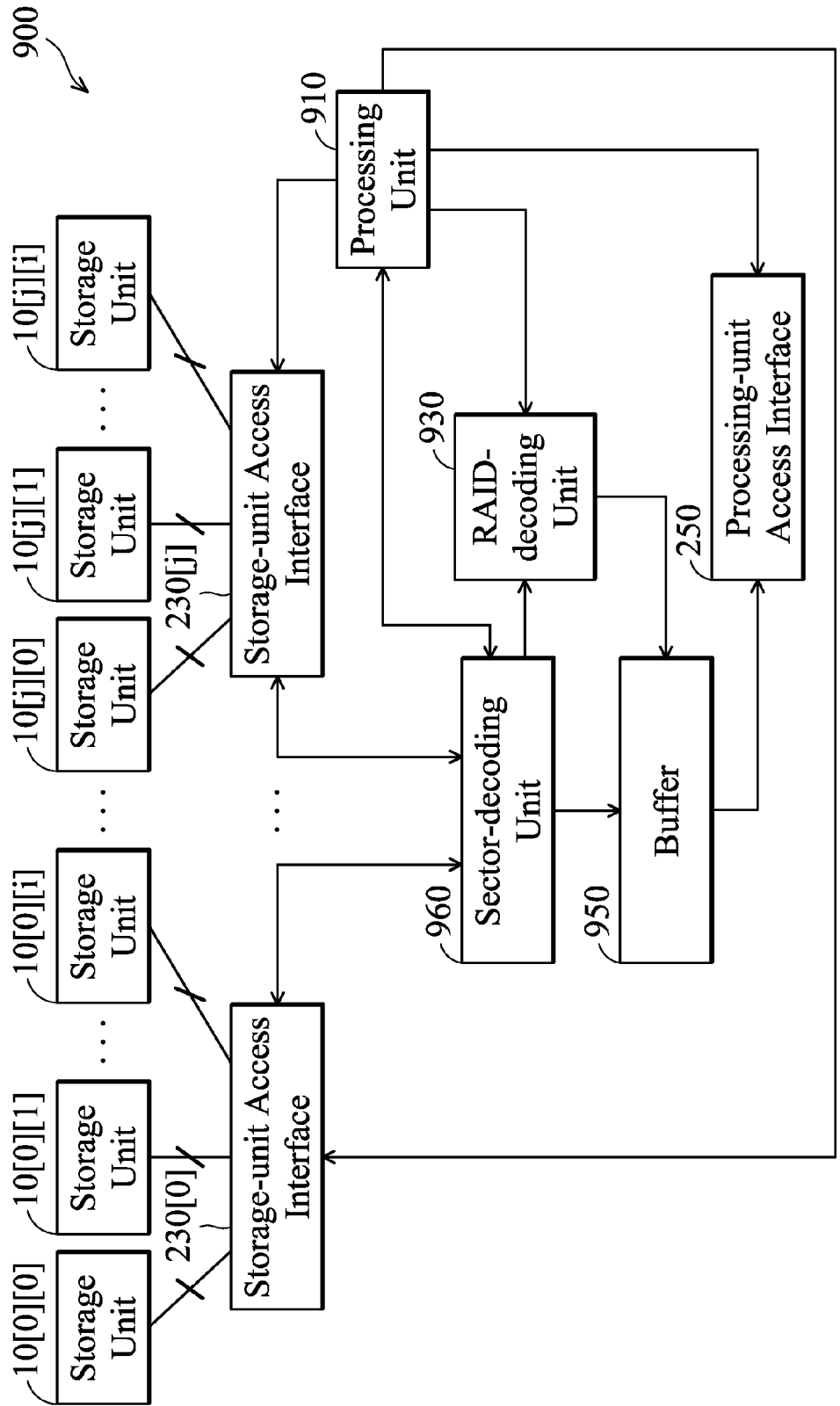
FIG. 9 is a system block diagram for reading data according to an embodiment of the invention.

FIG. 9 is a system block diagram for reading data according to an embodiment of the invention. The processing unit 910 may be implemented in numerous ways, such as with dedicated hardware, or with general-purpose hardware (e.g., a single processor, multiple processors or graphics processing units capable of parallel computations, or others) that is programmed using microcode or software instructions to perform the functions recited hereinafter. Any of the storage units 10[0][0] to 10[j]/[i] may include multiple SLCs. After reading values of a sector from a designated storage unit, the storage-unit access interface, such as one of the storage-unit access interfaces 230[0] to 230[j], transmits the read values to a sector-decoding unit 960. The sector-decoding unit 960 inspects whether the read message has any errors by using the read horizontal ECC, and if so, attempts to correct the error bit(s) by using a typical error correction algorithm with the horizontal ECC. When the read message has no errors or the correction is successful, the sector-decoding unit 960 drops the horizontal ECC and stores the original or corrected message into the buffer 950, thereby enabling an electronic device to read the decoded message via the processing-unit access interface 250. When the errors cannot be fixed although the error correction algorithm is used with the read horizontal ECC, the sector-decoding unit 960 sends a message to the processing unit 910, which contains at least information regarding an address of the unrecoverable sector. Following that, the processing unit 910 activates a vertical correction procedure. In the vertical correction procedure, the processing unit 910 obtains information regarding which RAID group contains the unrecoverable sector, and finds addresses for the other sectors including that storing the corresponding vertical ECC within the RAID group. For example, refer to FIG. 5B. Assume that the message 510[0][0][0] of the sector 410[0][0][0] has unrecoverable errors although a typical error correction algorithm is used with the horizontal ECC 530[0][0][0]: The other sectors within the same RAID group, sectors 410[0][1][0] to 410[j]/[i][0], can be employed by the error correction algorithm to fix the error bit(s) presented in the message 510[0][0][0]. Next, the processing unit 910 informs the sector-decoding unit 960 that the vertical correction procedure has been activated, determines the other sectors corresponding the unrecoverable sector and directs the storage-unit access interface 230[0] to 230[j] to read values of the determined sectors in sequence. In cases where the vertical correction procedure has been activated, the sector-decoding unit 960 obtains values of the determined sectors through the storage-unit access interface 230[0] to 230[j], and after successfully decoding the messages, transmits the decoded results to a RAID-decoding unit 930. The RAID-decoding unit 930 recovers the previously unrecoverable errors according to the decoded results of the other sectors, including the decoded messages and vertical ECC(s), and stores the outcome to the buffer 950, thereby enabling an electronic device to read the corrected message through the processing-unit access interface 250. It should be noted that, in practice, the processing unit 910 of FIG. 9 and the processing unit 610 of FIG. 6 may be the same, and the invention should not be limited thereto.

Figure 10:
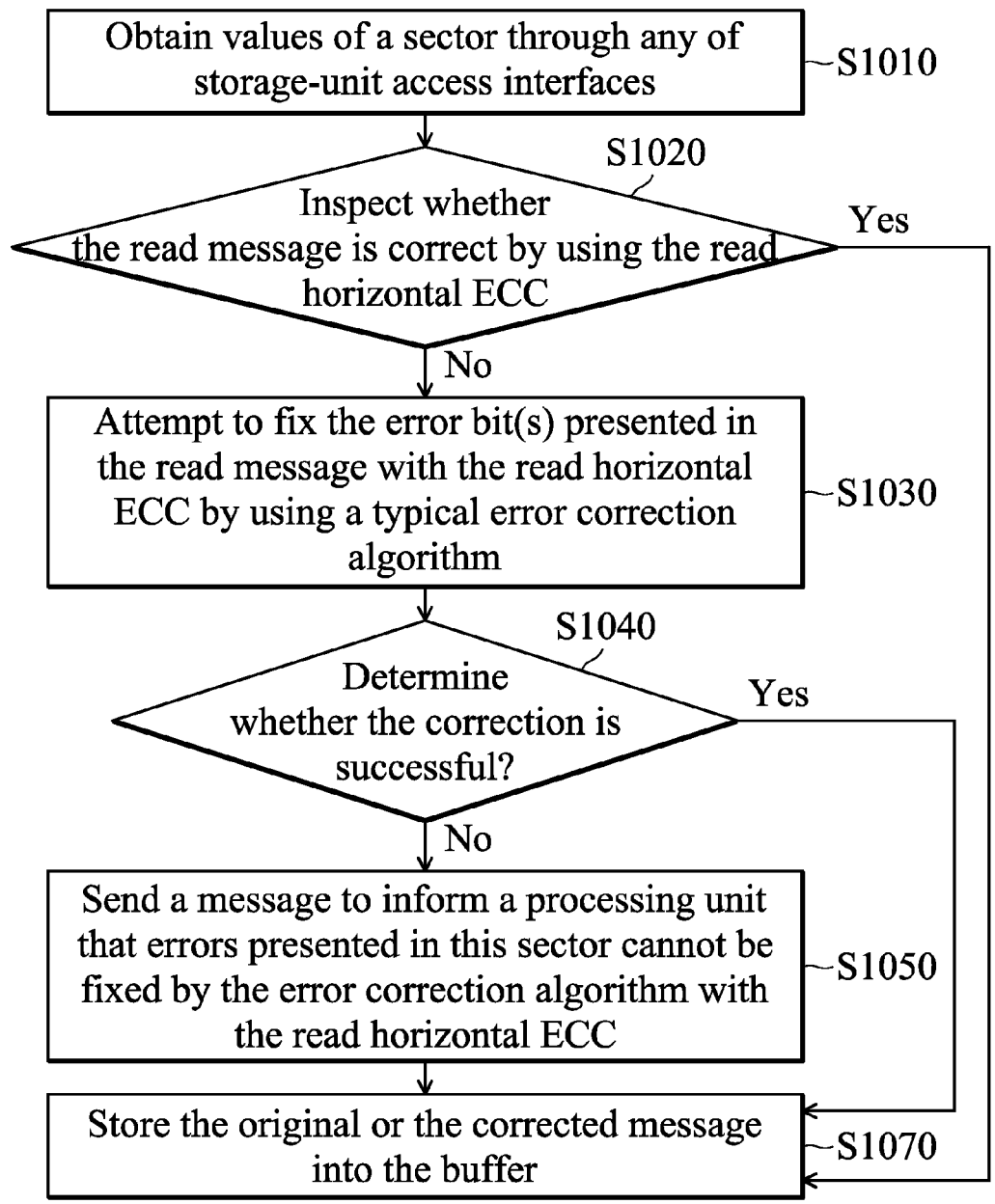
FIG. 10 is a flowchart illustrating a method for reading data, performed by a sector-decoding unit, according to an embodiment of the invention.

FIG. 10 is a flowchart illustrating a method for reading data, performed by a sector-decoding unit, according to an embodiment of the invention. After obtaining values of a sector through any of the storage-unit access interfaces 230[0] to 230[j] (step S1010), the sector-decoding unit 960 inspects whether the read message is correct by using the read horizontal ECC (step S1020). If correct (the "yes" path of step S1020), then the sector-decoding unit 960 stores the original message into the buffer 950 (step S1070); otherwise (the "no" path of step S1020), attempts to fix the error bit(s) presented in the read message with the read horizontal ECC by using a typical error correction algorithm (step S1030). Then, the sector-decoding unit 960 determines whether the correction is successful (step S1040). If successful (the "yes" path of step S1040), then the sector-decoding unit 960 stores the corrected message into the buffer 950 (step S1070); otherwise (the "no" path of step S1040), it sends a message to inform the processing unit 910 that errors presented in this sector cannot be fixed by the error correction algorithm with the read horizontal ECC (step S1050).

Figure 11:
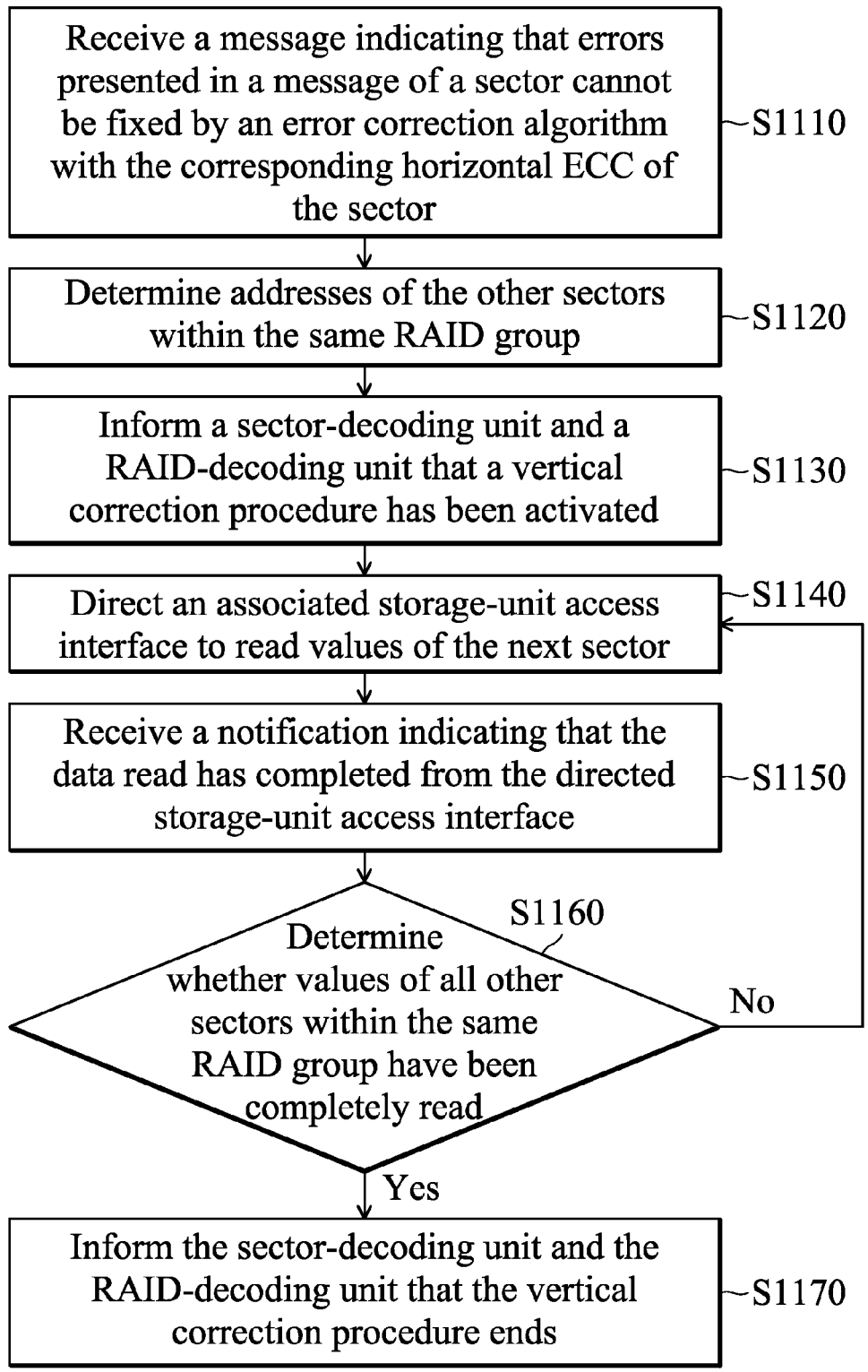
FIG. 11 is a flowchart illustrating a method for reading data, performed by a processing unit, according to an embodiment of the invention.

FIG. 11 is a flowchart illustrating a method for reading data, performed by a processing unit, according to an embodiment of the invention. After receiving a notification indicating that errors presented in a message of a sector cannot be fixed by an error correction algorithm with the corresponding horizontal ECC of the sector (step S1110), the processing unit 910 determines addresses of the other sectors within the same RAID group (step S1120). For example, refer to FIG. 5B. Assume that the message 510[0][0][0] of the sector 410[0][0][0] has unrecoverable errors although a typical error correction algorithm is used with the horizontal ECC 530[0][0][0]: The other sectors within the same RAID group, sectors 410[0][1][0] to 410[j]/[i][0], can be employed by the error correction algorithm to fix the error bit(s) presented in the message 510[0][0][0]. The processing unit 910 informs the sector-decoding unit 960 and the RAID-decoding unit 930 that a vertical correction procedure has been activated (step S1130). After receiving the information, the sector-decoding unit 960 will read and decode values received through one of the storage-unit access interfaces 230[0] to 230[j], and alter the output of the decoded results to the RAID-decoding unit 930 rather than the buffer 950. Next, the processing unit 910 repeatedly performs a loop for directing the storage-unit access interfaces 230[0] to 230[j] to read the determined sectors. In the loop, the processing unit 910 directs an associated storage-unit access interface to read values of the next sector (step S1140). The directed storage-unit access interface transmits the read-out values to the sector-decoding unit 960. The sector-decoding unit 960 decodes a message therefrom and transmits the decoded message to the RAID-decoding unit 930, and then, the RAID-decoding unit 930 generates a new message according to the currently stored result and the newly received message, where the currently stored result is derived from a collection of previously received messages. After receiving a notification indicating that the data read has completed from the directed storage-unit access interface (step S1150), the processing unit 910 determines whether values of all other sectors within the same RAID group have been completely read (step S1160). If so (the "yes" path of step S1160), then the loop ends; otherwise (the "no" path of step S1160), the processing unit 910 directs an associated storage-unit access interface to read values of the next sector (step S1140). After the loop ends, the processing unit 910 informs the sector-decoding unit 960 and the RAID-decoding unit 930 that the vertical correction procedure ends (step S1170). After receiving the information, the sector-decoding unit 960 will alter the output of the decoded results back to the buffer rather than the RAID-decoding unit 930. On the other hand, after receiving the information, the RAID-decoding unit 930 stores the up-to-date message to the buffer 950 as the recovery result.

Figure 12:
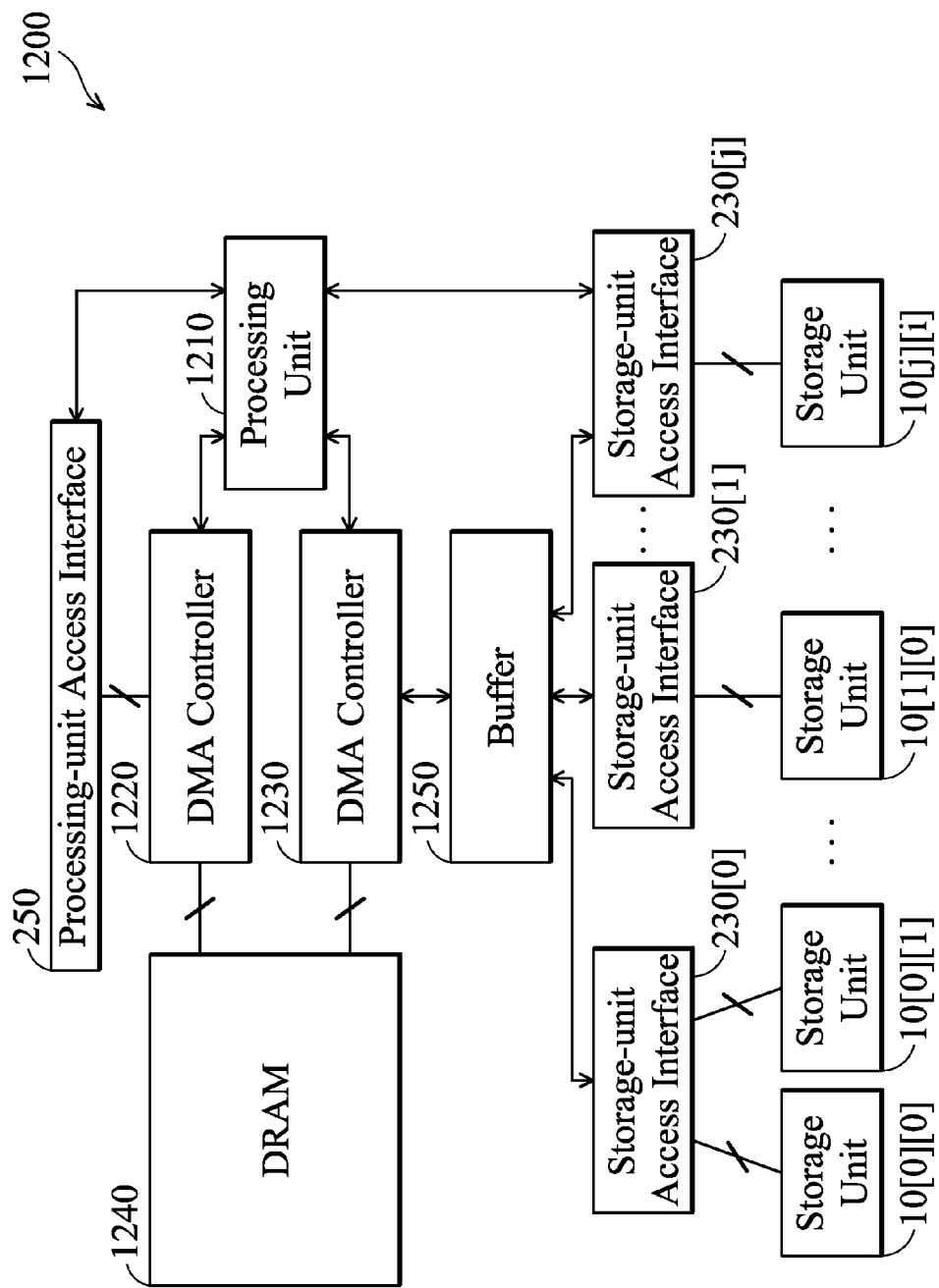
FIG. 12 is a system block diagram for programming data according to an embodiment of the invention.
Figure 17A:
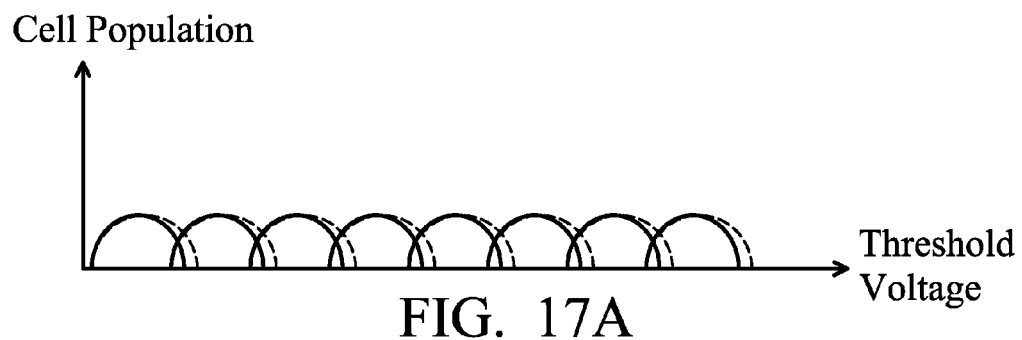
FIGS. 17A to 17C are schematic diagrams illustrating the variations of threshold voltage distributions of TLCs on a wordline that has undergone three rounds of programming according to an embodiment of the invention.
Figure 17B:
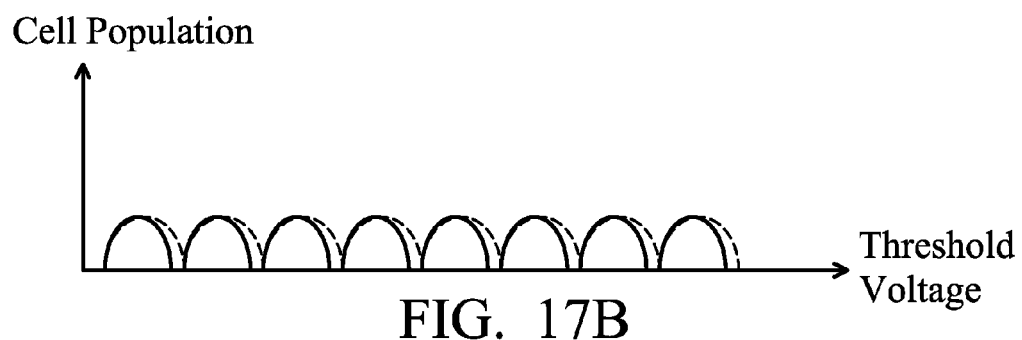
Figure 17C:
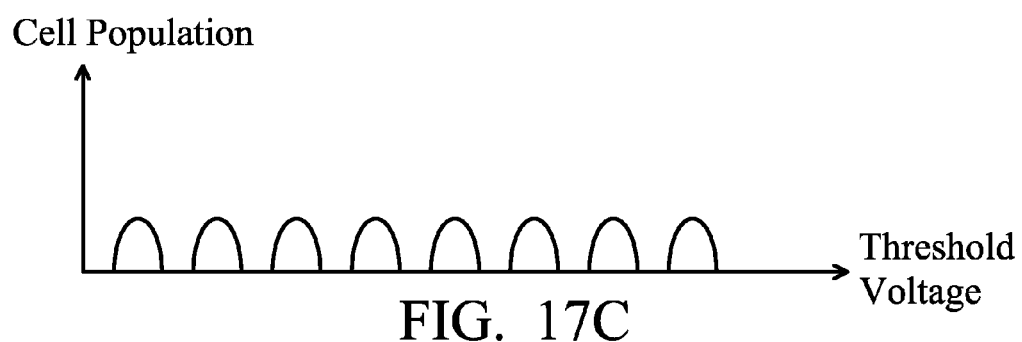

FIG. 12 is a system block diagram for programming data according to an embodiment of the invention. The processing unit 1210 may be implemented in numerous ways, such as with dedicated hardware, or with general-purpose hardware (e.g., a single processor, multiple processors or graphics processing units capable of parallel computations, or others) that is programmed using microcode or software instructions to perform the functions recited hereinafter. Any of the storage units 10[0][0] to 10[j][i] may include multiple memory cells, each of which is practiced by a TLC. The processing unit 1210 may program data wordline by wordline, where each wordline may store values of several pages. Although the embodiment will describe having specific features in the following paragraph, such as three pages being included per wordline, it should be noted that these are merely exemplary features, and the invention is equally applicable to systems having more or fewer pages per wordline. A single page may store a message of 8K, 16K, 32K or 64K bytes. Since each TLC of a wordline may leak the stored charges or absorb additional charges resulting from the programming of nearby wordline(s) and, thus, alter its threshold voltage, what is needed are operations for programming each TLC several rounds to maintain the stored value as expected. The programming methods to be described as follows may be referred to as a F&F (Foggy and Fine) manner. FIGS. 17A to 17C are schematic diagrams illustrating the variations of threshold voltage distributions of TLCs on a wordline that has undergone three rounds of programming according to an embodiment of the invention. After the first round of programming, the threshold voltage distribution is shown as the solid line FIG. 17A. It could be observed from FIG. 17A that, after the first coarse programming, the threshold voltage distribution does not reflect the eight distinguishing states as expected. The subsequent programming of the nearby wordlines affects the previously stored charges of TLCs on the wordline, making the threshold voltage distribution worse, as shown in the dash lines of FIG. 17A. The second round of the programming is then performed to the TLCs on the same wordline to modify the stored charges to achieve the ideal threshold voltage. After that, the threshold voltage distribution is shown as the solid line of FIG. 17B, which reflects the eight distinguishing states. However, after the subsequent programming of the nearby wordlines, the adjacent states of threshold voltage distribution may be affected by overlap, as shown in the dash lines of FIG. 17B. In order to achieve the ideal distribution, the third round of programming is then performed to the TLCs on the same wordline to produce a wider interval between any two states of the threshold voltage distribution. The resulting threshold voltage distribution after the three rounds of programming may refer to FIG. 17C. Refer back to FIG. 12. In order to overcome the aforementioned limitations, the buffer 1250 is configured to store three pages of values while the DRAM 1240 is configured to temporarily store nine pages of values received from an electronic device via the processing-unit access interface 250. The processing unit 1210 may direct a DMA controller 1220 to store the values from the processing-unit access interface 250 into a designated address of the DRAM 1240, where the latest received page of values may overwrite the earliest received one. It should be understood that the values of the overwritten page have been steadily stored in the designated memory cells after three rounds of the programming to be described as follows. The DRAM 1240 may be integrated into the SOC (System On Chip) including at least the components 230[0 . . . j], 250, 1210, 1230 and 1250, or implemented in an independent chip. The processing unit 1210 may direct the DMA controller 1230 to read three pages of values from the DRAM 1240 and store the read values into the buffer 1250, and direct an associated storage-unit access interface, such as one of the storage-unit access interfaces 230[0] to 230[j], to program the values of the buffer 1250 into the designated TLCs of the designated wordline of the designated storage unit. FIG. 13 is a schematic diagram showing a TLC block of a storage unit according to an embodiment of the invention. The TLC block 1300 may store 192 pages of values in total, labeled from PG0 to PG191. Each wordline may store three pages of values, and the wordlines are labeled from WL0 to WL63. Please refer to FIG. 16C. All LSBs of TLCs on each wordline form one page of values collectively while all CSBs and MSBs of TLCs on each wordline collectively form the other two pages of values, respectively. In order to stabilize the programmed values of the storage unit, the processing unit 1210 not only programs the latest received three pages of values, which are stored in the DRAM 1240, into the TLC block 1300, but also reads the prior six pages of values from the DRAM 1240 in two batches, which have been programmed into the storage unit, and programs the read pages into the TLCs on the designated wordlines again via the designated storage-unit access interface. For example, after programming the page values PG6 to PG8 into the TLCs on the wordline WL2, the processing unit 1210 directs the DMA controller 1230 to read page values PG0 to PG2 from the DRAM 1240 and store the read data into the buffer 250 and directs the designated storage-unit access interface to program the values of the buffer 250 into the TLCs on the wordline WL0, and then, directs the DMA controller 1230 to read page values PG3 to PG5 from the DRAM 1240 and store the read data into the buffer 250 and directs the designated storage-unit access interface to program the values of the buffer 250 into the TLCs on the wordline WL1. FIG. 21 is a schematic diagram depicting a programming sequence for wordlines of a storage unit according to an embodiment of the invention. The programming sequence may be recorded in a lookup table 2100, and therefore, the processing unit 1210 determines which wordline and pages to be programmed in each batch accordingly. The lookup table 2100 contains three fields respectively recording a sequential number for the first, second and third rounds of programming for each of the wordlines WL0 to WL63. Due to the values stored in the TLCs not being stable until a specified rounds of programming, the processing unit 1210 first determines whether the requested values have been programmed into the TLCs stably after receiving a data read command from an electronic device via the processing-unit access interface 250. If so, the processing unit 1210 reads values from a designated address of a designated storage unit via the associated storage-unit access interface, such as one of the storage-unit access interfaces 230[0] to 230[j], and replies to the electronic device with the read values; otherwise, it reads values to be programmed into the designated address of the designated storage unit from the DRAM 1240 and replies to the electronic device. It should be noted that the DRAM 1240 or a register (not shown) may store information regarding the fact that the values, which are stored in the DRAM 1240 temporarily, will be programmed into which address of which storage unit, and the processing unit 1210 may determine whether the requested values have been programmed into the TLCs stably in light of the stored information. Specifically, if the address of the requested values falls within the addresses to be programmed for the values of the DRAM 1240 according to the information stored in the DRAM 1240 or the register (not shown), then the processing unit 1210 determines that the requested values haven't been programmed into the TLCs stably.

Figure 14:
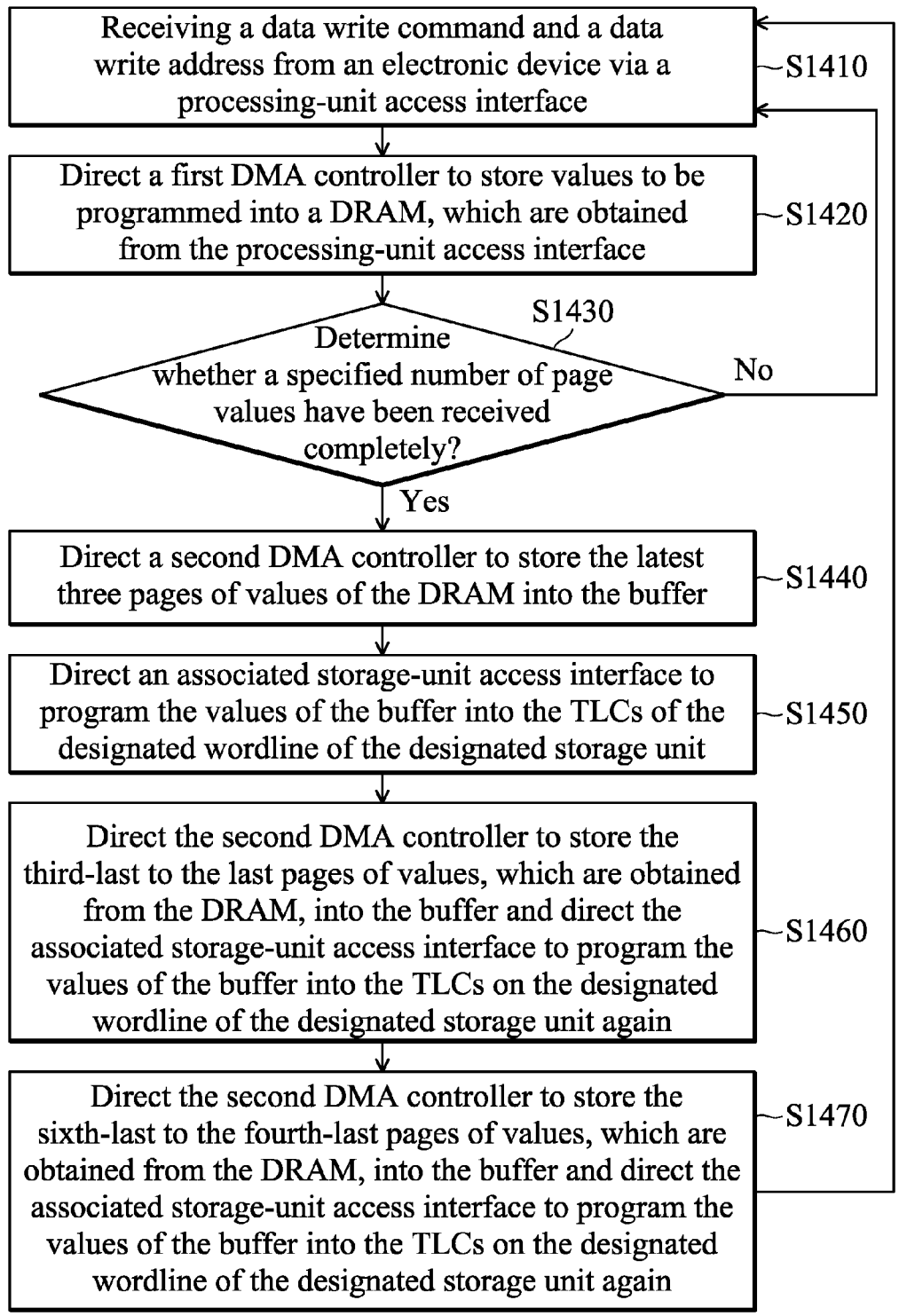
FIG. 14 is a flowchart illustrating a method for programming data, performed by a processing unit, according to an embodiment of the invention.

FIG. 14 is a flowchart illustrating a method for programming data, performed by a processing unit, according to an embodiment of the invention. After receiving a data write command and a data write address from an electronic device via the processing-unit access interface 250 (step S1410), the processing unit 1210 directs the DMA controller 1220 to store values to be programmed into the DRAM 1240, which are obtained from the processing-unit access interface 250 (step S1420). It is determined whether a specified number of page values have been received completely (step S1430), for example, values from the nth page to the (n+2)th page. If so, the processing unit 1210 performs a physical data programming (steps S1440 to S1470); otherwise, it continues to receive the remaining page values from the processing-unit access interface 250 (steps S1410 to S1420). In the physical data programming, the processing unit 1210 directs the DMA controller 1230 to store the latest three pages of values of the DRAM 1240 into the buffer 1250 (step S1440), and directs an associated storage-unit access interface, such as one of the storage-unit access interfaces 230[0] to 230[*j*], to program the values of the buffer 1250 into the TLCs of the designated wordline of the designated storage unit (step S1450). In order to stabilize the programmed values of the storage unit from being affected by the data programming for the nearby wordlines, the processing unit 1210 further directs the DMA controller 1230 to store the prior six pages of values of the DRAM 1240, which have been programmed lately, into the buffer 1250 again in two batches, and, during each batch, directs an associated storage-unit access interface, such as one of the storage-unit access interfaces 230[0] to 230[*j*], to program the values of the buffer 1250 into the TLCs on the designated wordline again. Specifically, the processing unit 1210 directs the DMA controller 1230 to store the third-last to the last pages of values prior to that programmed in step S1450, which are obtained from the DRAM 1240, into the buffer 1250, such as the (n−3)th to (n−1)th pages, and directs the associated storage-unit access interface to program the values of the buffer 1250 into the TLCs on the designated wordline of the designated storage unit again (step S1460). Following that, the processing unit 1210 directs the DMA controller 1230 to store the sixth-last to the fourth-last pages of values prior to that programmed in step S1450, which are obtained from the DRAM 1240, into the buffer 1250, such as the (n−6)th to (n−4)th pages, and directs the associated storage-unit access interface to program the values of the buffer 1250 into the TLCs on the designated wordline of the designated storage unit again (step S1470).

Figure 15:
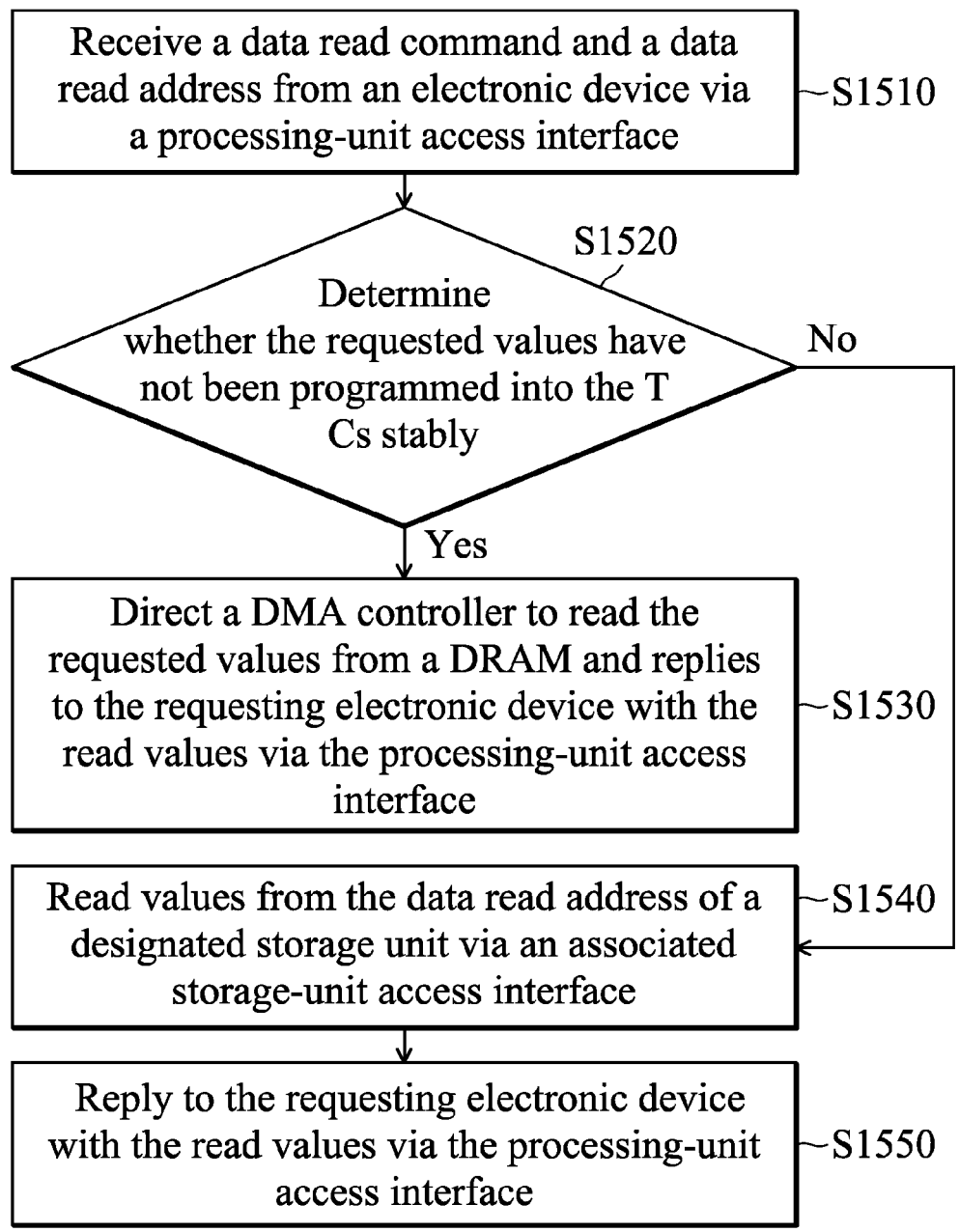
FIG. 15 is a flowchart illustrating a method for reading data, performed by a processing unit, according to an embodiment of the invention.

FIG. 15 is a flowchart illustrating a method for reading data, performed by a processing unit, according to an embodiment of the invention. After receiving a data read command and a data read address from an electronic device via the processing-unit access interface 250 (step S1510), the processing unit 1210 determines whether the requested values have not been programmed into the TLCs stably (step S1520). If so, the processing unit 1210 directs the DMA controller 1220 to read the requested values from the DRAM 1240 and replies to the requesting electronic device with the read values via the processing-unit access interface 250 (step S1530); otherwise, it reads values from the data read address of a designated storage unit via an associated storage-unit access interface (step S1540), and replies to the requesting electronic device with the read values via the processing-unit access interface 250 (step S1550).

Figure 18A:
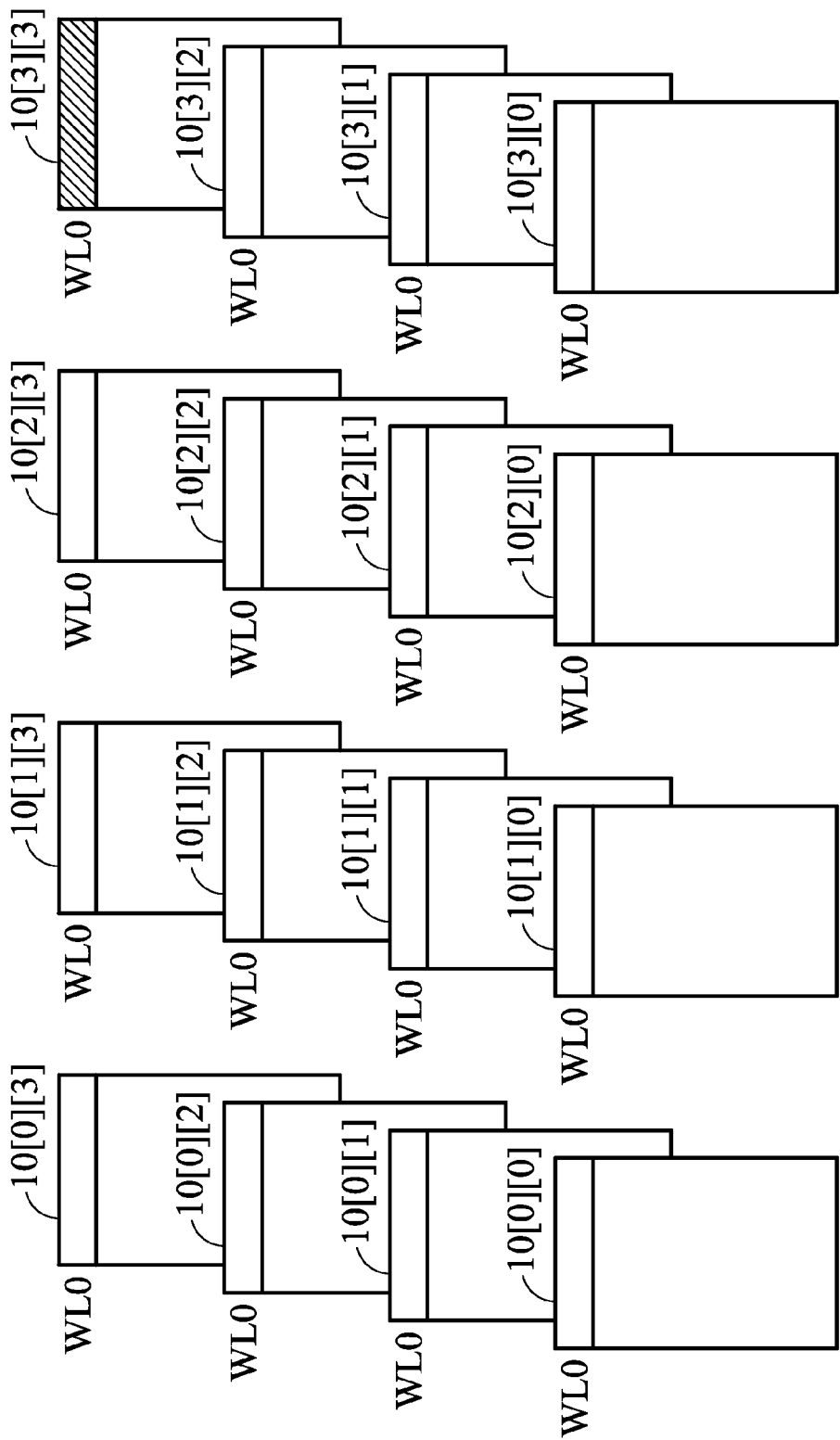
FIG. 18A is a schematic diagram of the data placement with vertical ECCs of the RS(48,45) within a RAID group according to an embodiment of the invention.
Figure 18B:
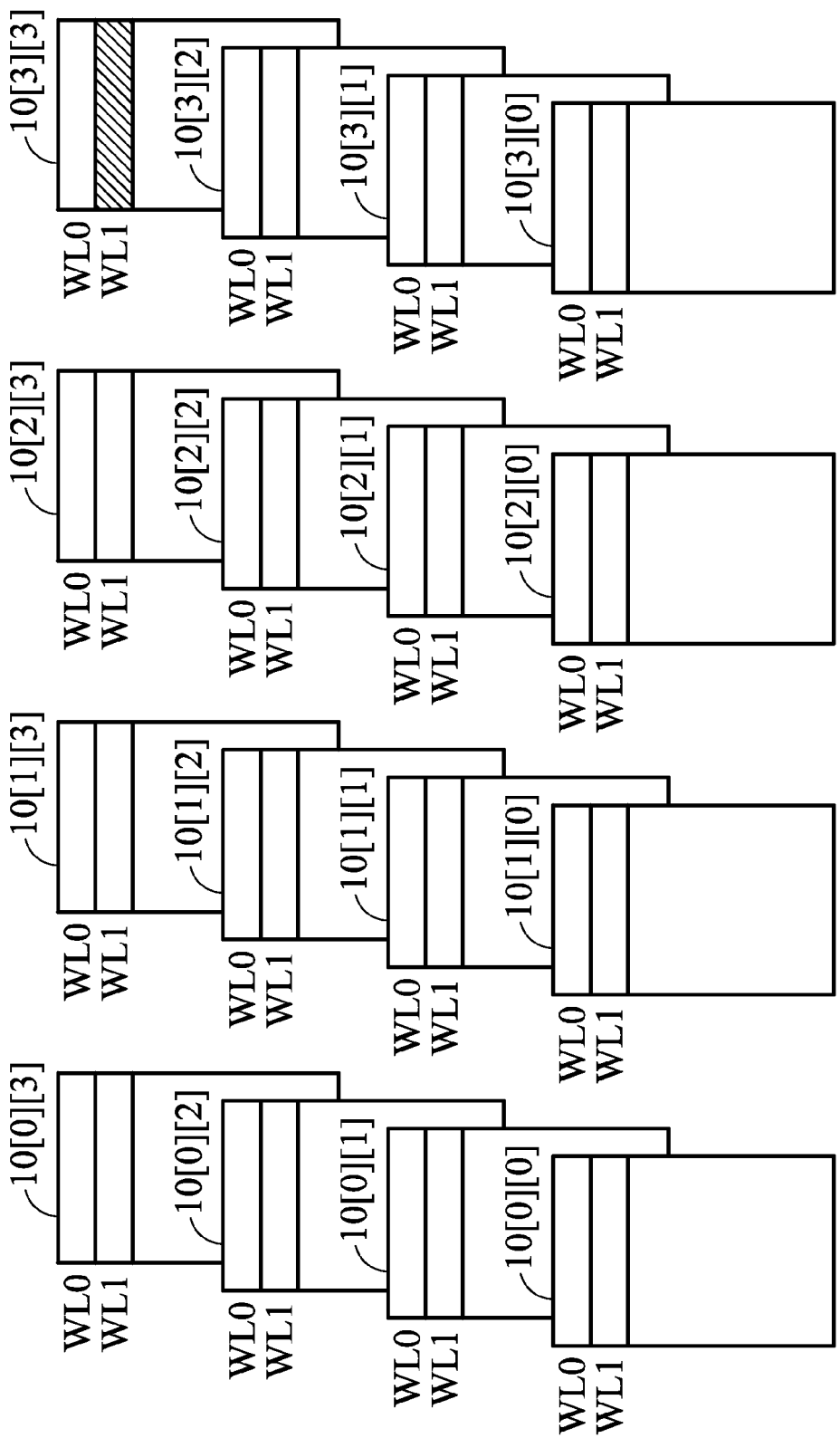
FIG. 18B is a schematic diagram of the data placement with vertical ECCs of the RS(96,93) within a RAID group according to an embodiment of the invention.
Figure 19B:
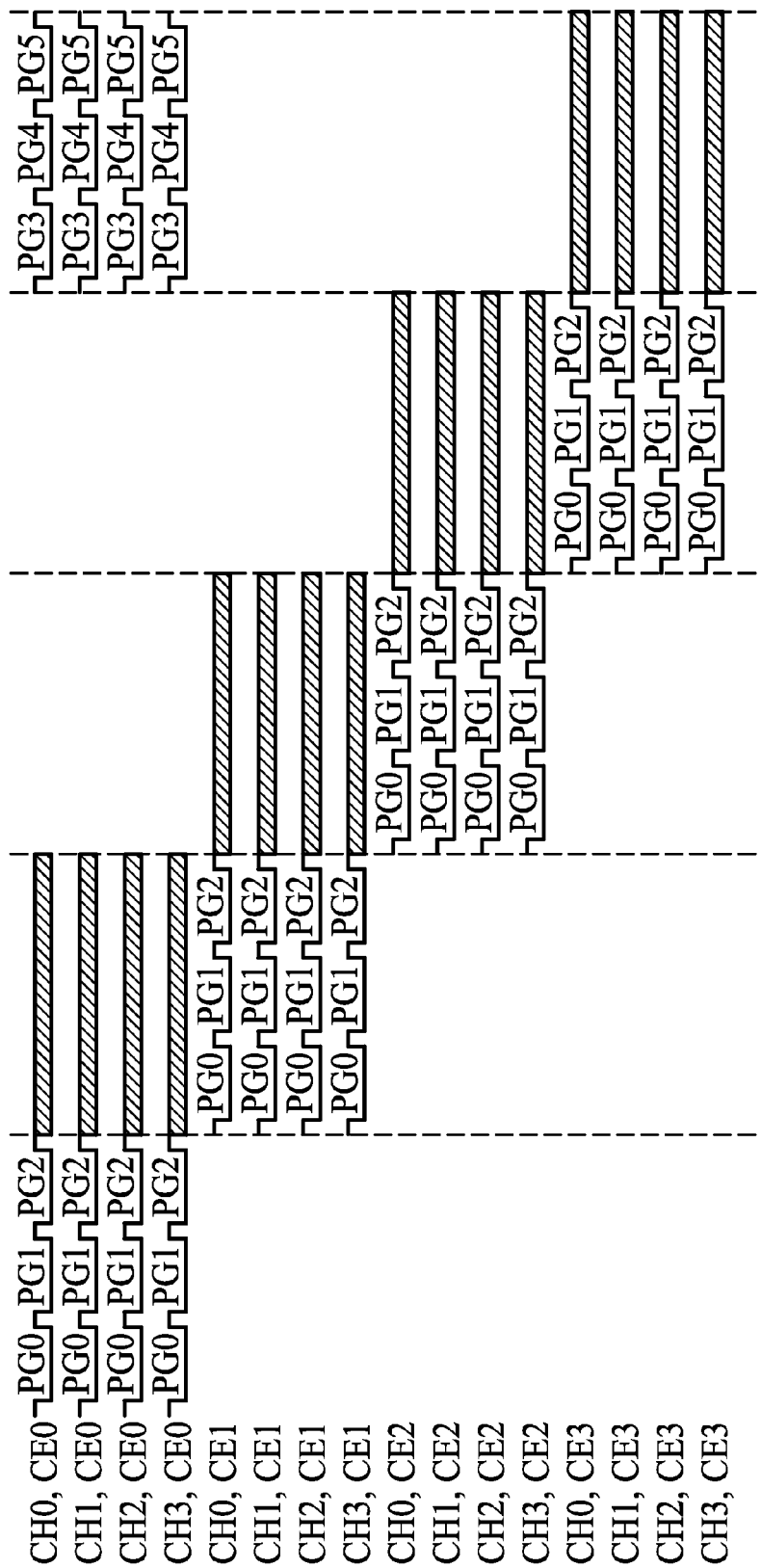
FIG. 19B is a timing diagram for programming data according to an embodiment of the invention.
Figure 20A:
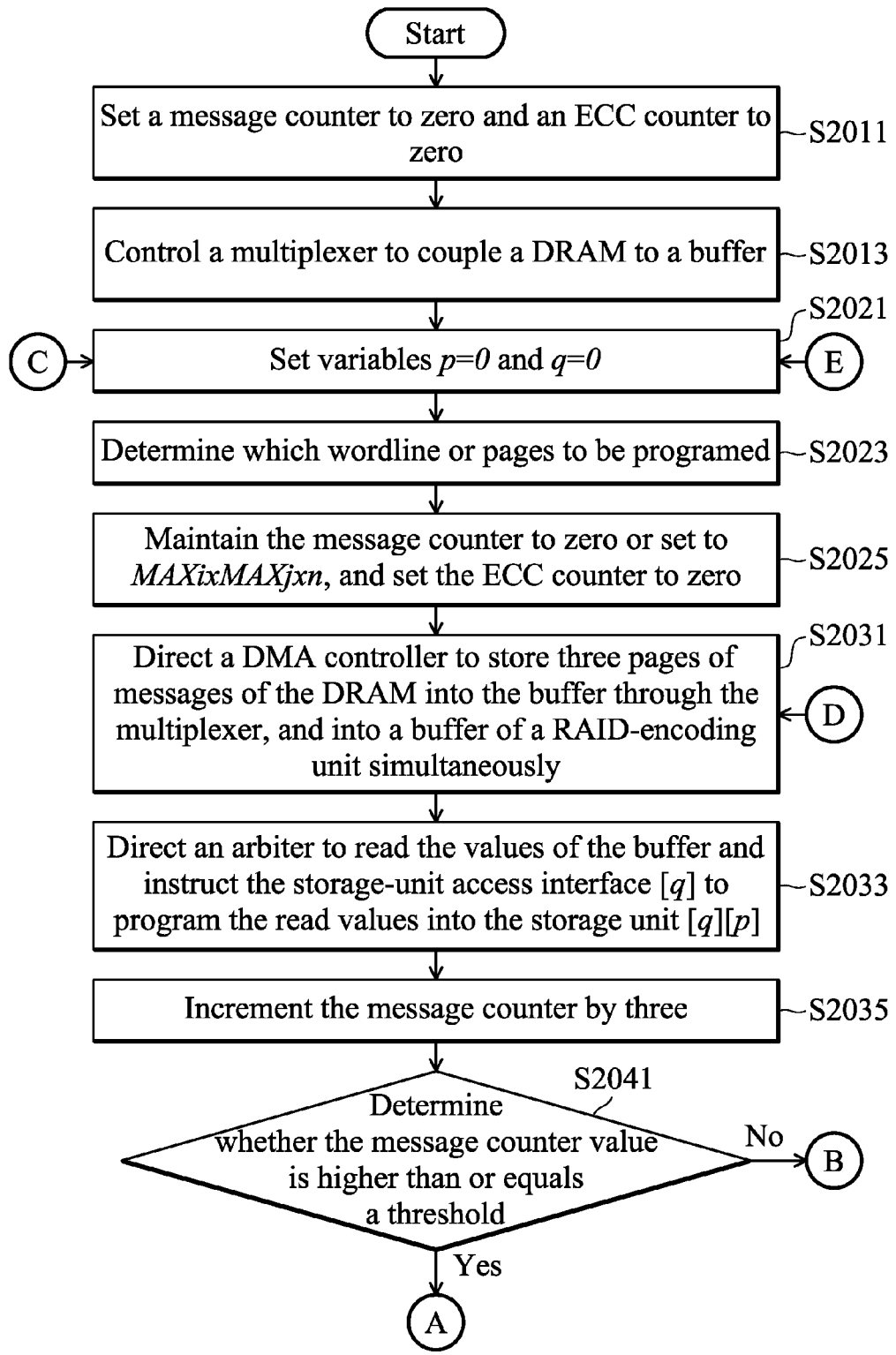
FIGS. 20A to 20D are flowcharts for programming data, performed by a processing unit, according to an embodiment of the invention.
Figure 20B:
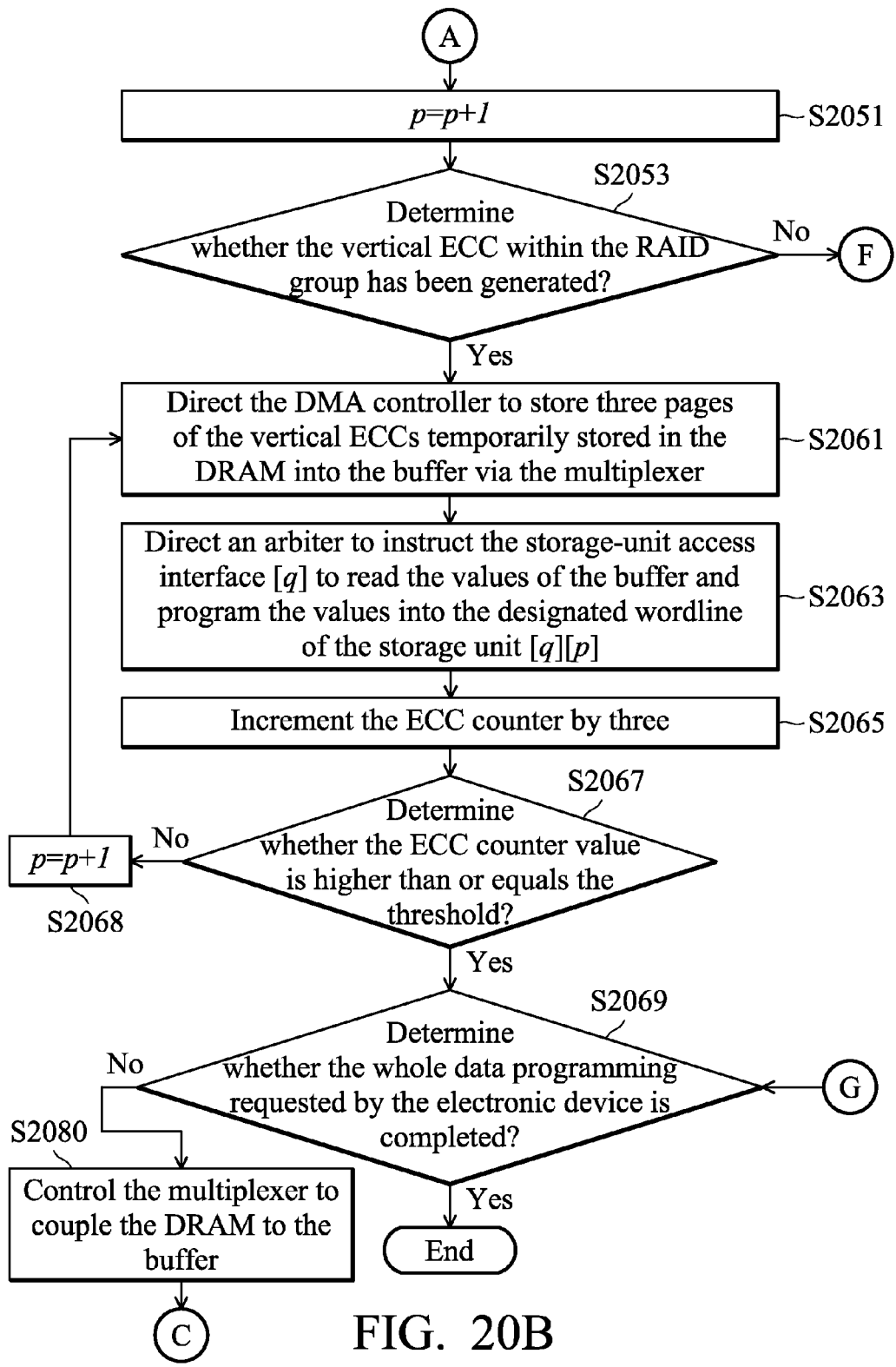
Figure 20C:
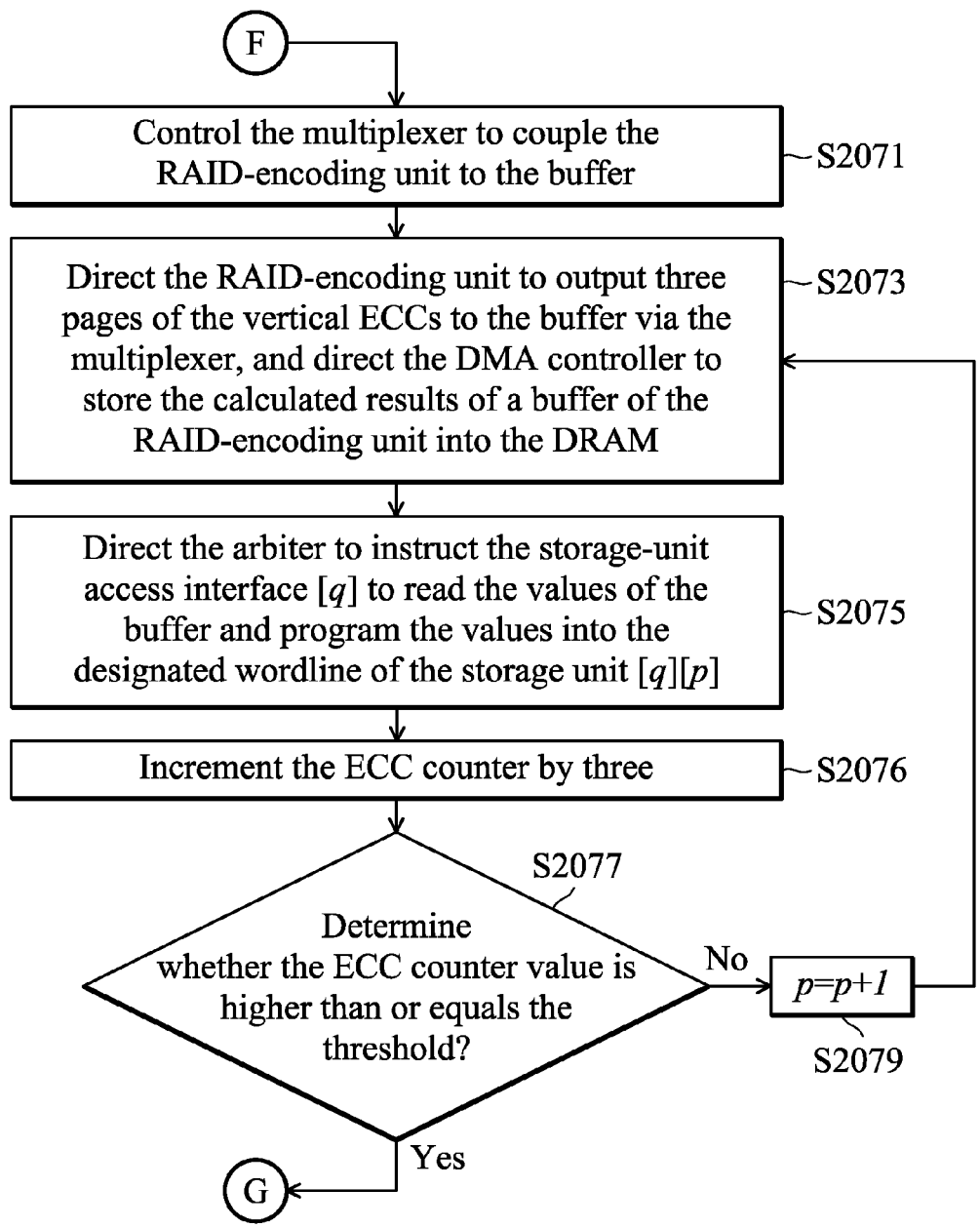
Figure 20D:
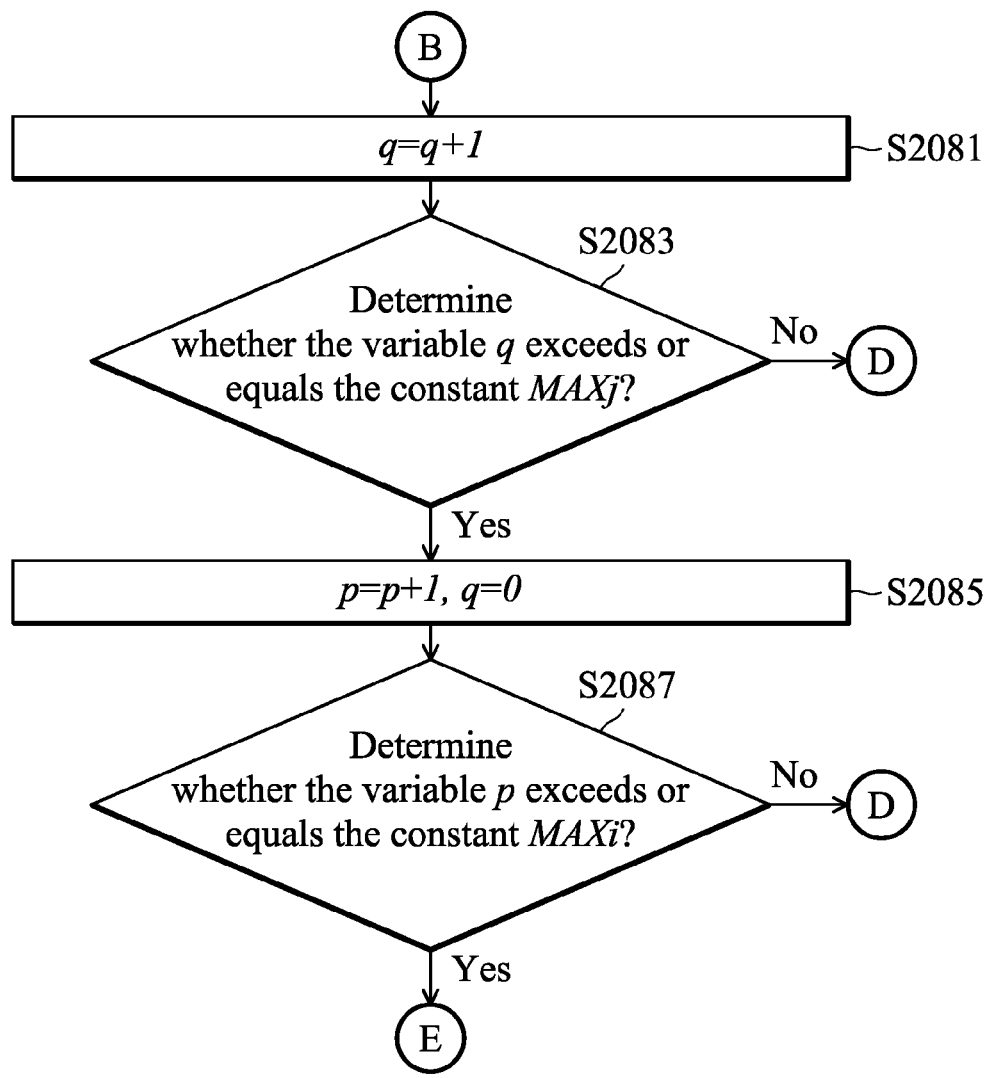

The flash memory having TLCs may further store vertical ECCs to secure the stored data (including messages and horizontal ECCs) so as to form the two-dimensional ECC protection. An embodiment of the invention introduces a placement for the messages and ECCs to improve the efficiency of data programming. Assume that i=3, j=3 and each wordline stores three pages of messages with horizontal ECCs, or vertical ECCs: FIG. 18A is a schematic diagram of the data placement with vertical ECCs of the RS(48,45) within a RAID group according to an embodiment of the invention. A RAID group is formed to contain 48 pages on the first wordlines WL0 of the 16 storage units 10[0][0] to 10[3][3], where the first wordline WL0 of the storage unit 10[3][3] as shown in shadow stores three pages of vertical ECCs. FIG. 18B is a schematic diagram of the data placement with vertical ECCs of the RS(96,93) within a RAID group according to an embodiment of the invention. A RAID group is formed to contain 96 pages on the first and second wordlines WL0 and WL1 of the 16 storage units 10[0][0] to 10[3][3], where the second wordline WL1 of the storage unit 10[3][3] as shown in shadow stores three pages of vertical ECCs. The stored values may be recoverable when a whole storage unit of the flash memory, such as one of the storage units 10[0][0] to 10[3][3], fails because the page values with the horizontal ECCs, and the associated vertical ECCs within a RAID group are spread in different physical storage units. On top of that, the aforementioned placement may also improve the efficiency of data programming. Please refer to FIG. 6. The processing unit 610 may direct the arbiter 660 to program the page values into the first wordline of each storage unit in a predefined sequence. FIG. 19B is a timing diagram for programming data according to an embodiment of the invention. The storage-unit access interfaces 230[0] to 230[3] are denoted as channels CH0 to CH3 respectively, and storage units associated with each storage-unit access interface are denoted as CE0 to CE3 respectively. FIG. 19B illustrates an example of programming three data pages PG0, PG1 and PG2 including messages, horizontal ECCs, and/or vertical ECCs into the first wordlines WL0 of the storage units 10[0][0] to 10[3][3]. The arbiter 660 transmits relevant portions of the data pages PG0, PG1 and PG2 to buffers (not shown) of the first connected storage units CE0 via the channels CH0 to CH3, respectively, and then issues data write commands to the connected storage units CE0, so as to start the physical data programming. The storage unit CE0 enters the busy state for a time period to program the data pages PG0, PG1 and PG2 stored in the buffer into TLCs on the wordline WL0 after receiving the data write command. When the storage units CE0 perform the physical data programming, the channels CH0 to CH3 are available and the arbiter 660 can employ the channels CH0 to CH3 to transmit relevant portions of the data pages PG0, PG1 and PG2 to buffers (not shown) of the second connected storage units CE1. Those skilled in the art may observe that the aforementioned data placement for a RAID group results in the reduction of spare time on the channels CH0 to CH3 and yields better data throughput in the transmission to the storage units.

The storage units 10[0][0] to 10[j][i] of FIG. 6 may be devised to contain multiple TLCs. FIGS. 20A to 20D are flowcharts for programming data, performed by a processing unit, according to an embodiment of the invention. During a data programming for a RAID group, the processing unit 610 sets a message counter to zero and an ECC counter to zero (step S2011) and controls the multiplexer 640 to couple the DRAM 620 to the buffer 650 (step S2013). Subsequently, a loop including steps S2021 to S2087 is repeatedly performed until all messages within the RAID group are programmed into the designated storage units completely, for example, the wordlines WL0 of the storage units 10[0][0] to 10[j][i] as shown in FIG. 18A, or the wordlines WL0 and WL1 of the storage units 10[0][0] to 10[j][i] as shown in FIG. 18B.

Steps S2021 to S2031 are preparation steps for programming data into designated wordlines of all storage units. The processing unit 610 employs a variable q to record which storage-unit access interface is used for the current data programming, and a variable p to record which storage unit associated with the used storage-unit access interface is to be programmed for the current data programming. In order to stabilize the programmed values of the storage unit, the described method for programming values on wordlines as shown in FIG. 14 may be adopted to ensure each wordline can be repeatedly programmed at least three times, and each round of programming is interlaced with that of the nearby wordlines. At the beginning of the data programming for the first wordline of the first storage unit, the processing unit 610 sets p=0 and q=0 (step S2021). The processing unit 610 then determines which wordline or pages are to be programmed, for example, the wordline WL0 or the pages PG0 to PG2 (step S2023). The message counter is maintained at zero or set to MAXi×MAXj×n, and the ECC counter is set to zero, where the constant MAXj indicates a total number of the storage-unit access interfaces, the constant MAXI indicates a total number of the storage units associated with one storage-unit access interface, and the variable n indicates a total number of the completed wordline(s) for this RAID group (step S2025). Taking the data placement for a RAID group with the vertical RS(96,93) ECC as shown in FIG. 18B as an example, the message counter is maintained to zero if the data programming is related to the first wordline WL0, and is set to 4×4×1=16 if the data programming is related to the second wordline WL1.

Steps S2031 to S2035 are performed to program messages and horizontal ECCs into the designated storage unit 10[q][p]. The processing unit 610 directs the DMA controller 621 to store three pages of messages of the DRAM 620 into the buffer 650 through the multiplexer 640, and into a buffer (not shown) of the RAID-encoding unit 630 simultaneously (step S2031). Next, the processing unit 610 directs the arbiter 660 to read the values of the buffer 650 and instruct the storage-unit access interface 230[q] to program the read values into the storage unit 10[q][p] (step S2033). After that, the processing unit 610 increments the message counter by three (step S2035). The programming timings for each storage unit may be referred to in the description of FIG. 19.

Steps S2041, S2081 and S2087 are performed to determine which storage-unit access interface and storage unit are to be used for the next data programming. After determining that the message counter value is lower than a threshold (the "no" path of step S2041), the processing unit 610 increments the variable q by one (step S2081). Taking the data placement for a RAID group with the vertical RS(96,93) ECC as shown in FIG. 18B as an example, the message counter value being lower than the threshold (for example, 93) indicates that the messages within the RAID group have not been programmed completely. Then, it is determined whether the variable q exceeds or equals the constant MAXj (step S2083). If not, the process proceeds to step S2031; otherwise, the processing unit 610 increments the variable p by one and sets the variable q to zero (step S2085) and determines whether the variable p exceeds or equals the constant MAXi (step S2087). When the variable p exceeds or equals the constant MAXi (the "yes" path of step S2087), it indicates that the designated wordlines of all storage units are completely programmed and the process proceeds to step S2021 to continue a data program for the next wordline. Otherwise (the "no" path of step S2087), the process proceeds to step S2031.

Due to the vertical ECCs being required to be program at least three times to become stable, an embodiment of the invention introduces a procedure for storing the vertical ECCs generated at the first time into the DRAM 620, and obtaining the generated vertical ECCs from the DRAM 620 for the subsequent re-programming, rather than calculating the vertical ECCs again. Taking the data placement for a RAID group with the vertical RS(96,93) ECCs as shown in FIG. 18B as an example, in another implementation for reprogramming the vertical ECCs, the RAID-encoding unit 630 reloads values of the wordlines WL0 and WL1 of the 16 storage units, except for the wordline WL1 of the storage unit 10[3][3], and accordingly regenerates the vertical ECCs to be reprogram in the wordline WL1 of the storage unit 10[3][3], however, it consumes redundant time to do so. Steps S2051 to S2079 are performed to program the vertical ECCs to the designated storage unit 10[q][p]. After determining that the message counter value is higher than or equal to the threshold (the "yes" path of step S2041), the processing unit 610 increments the variable p by one (step S2051). Next, the processing unit 610 determines whether the vertical ECC within the RAID group has been generated (step S2053). If so, the processing unit 610 directs the storage-unit access interface 230[q] to obtain the previously calculated results temporarily stored the DRAM 620, and program the obtained results into the storage unit 10[q][p] (steps S2061 to S2068); otherwise, it directs the storage-unit access interface 230[q] to obtain the encoding results by the RAID-encoding unit 630 and program the obtained results into the storage unit 10[q][p] (steps S2071 to S2079).

A loop including steps S2071 to S2079 is repeatedly performed until all vertical ECCs generated by the RAID-encoding unit 630 are completely programmed into a designated storage unit. Specifically, the processing unit 610 controls the multiplexer 640 to couple the RAID-encoding unit 630 to the buffer 650 (step S2071), directs the RAID-encoding unit 630 to output three pages of the vertical ECCs to the buffer 650 via the multiplexer 640, and directs the DMA controller 621 to store the calculated results of a buffer (not shown) of the RAID-encoding unit 630 into the DRAM 620 (step S2073). Next, the processing unit 610 directs the arbiter 660 to instruct the storage-unit access interface 230[q] to read the values of the buffer 650 and program the values into the designated wordline of the storage unit 10[q][p] (step S2075). After incrementing the ECC counter by three (step S2076), the processing unit 610 determines whether the ECC counter value is higher than or equal to a threshold, for example, the constant l, (step S2077). If so, the process proceeds to step S2069; otherwise, after the variable p is incremented by one (step S2079), the process loops back to step S2073 to continue the programming for the uncompleted vertical ECCs.

A loop including steps S2061 to S2068 is performed repeatedly until all vertical ECCs temporarily stored in the DRAM 620 are completely programmed into a designated storage unit. Specifically, the processing unit 610 directs the DMA controller 621 to store three pages of the vertical ECCs temporarily stored in the DRAM 620 into the buffer 650 via the multiplexer 640 (step S2061). Next, the processing unit 610 directs the arbiter 660 to instruct the storage-unit access interface 230[q] to read the values of the buffer 650 and program the values into the designated wordline of the storage unit 10[q][p] (step S2063). After incrementing the ECC counter by three (step S2065), the processing unit 610 determines whether the ECC counter value is higher than or equals the threshold, for example, the constant l, (step S2067). If so, the process proceeds to step S2069; otherwise, after the variable p is incremented by one (step S2068), the process loops back to step S2061 to continue the programming for the uncompleted vertical ECCs. Finally, the processing unit 610 determines whether the whole data programming requested by the electronic device is completed (step S2069). If so, the process ends; otherwise, the multiplexer 640 is controlled to couple the DRAM 620 to the buffer 650 (step S2080), the process loops back to step S2021 to continue the data programming for the next RAID group. Details of steps S2033, S2063 and S2075 may refer to the description of FIG. 8.

Although the embodiment has been described as having specific elements in FIGS. 1 to 3, FIG. 6, FIG. 9 and FIG. 12, it should be noted that additional elements may be included to achieve better performance without departing from the spirit of the invention. While the process flow described in FIGS. 7A to 7B, FIG. 8, FIGS. 10 to 11, FIGS. 14 to 15 and FIGS. 20A to 20D includes a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for accessing a storage unit of a flash memory, performed by a processing unit, comprising:

after receiving a notification indicating that errors presented in a message of a sector within a RAID (Redundant Array of Independent Disk) group cannot be fixed by an error correction algorithm with a horizontal ECC (Error Correction Code) of the sector, determining addresses of the other sectors within the RAID group;

providing a first information to a sector-decoding unit and a RAID-decoding unit, which indicates that a vertical correction procedure has been activated, wherein the sector-decoding unit, after receiving the first information from the processing unit, decodes the content read by the storage-unit access interfaces and transmits the decoded results to the RAID-decoding unit;

directing a plurality of storage-unit access interfaces to read content from the determined addresses of the storage unit, thereby enabling the RAID-decoding unit to recover the message of the sector by using the read content; and after the decoded results for the other sectors has been completely transmitted to the RAID-decoding unit, providing a second information to the RAID-decoding unit, which indicates that the vertical correction procedure ends, wherein the RAID-decoding unit, after receiving the second information, stores a decoded result corresponding to the previously received data for the RAID group from the sector-decoding unit to a buffer, and the decoded result corresponding to the previously received data for the RAID group is considered as the message of the sector.

2. The method of claim 1, wherein the sector-decoding unit attempts to correct the errors presented in the message of the sector within the RAID group by using the error correction algorithm with the horizontal ECC, and after failing to correct the errors, sends the notification to the processing unit.

3. The method of claim 1, wherein an electronic device reads the message of the sector stored in the buffer through a processing-unit access interface.

4. The method of claim 1, further comprising:

after the decoded results for the other sectors has been completely transmitted to the RAID-decoding unit, providing the second information to the sector-decoding unit.

5. The method of claim 4, wherein the sector-decoding unit, after receiving the second information, decodes the content read by the storage-unit access interfaces and stores the decoded results to a buffer.

6. The method of claim 1, wherein the other sectors comprise a vertical ECC.

7. The method of claim 6, wherein the vertical ECC is generated by a RAID-encoding unit according to messages within the RAID group.

8. An apparatus for accessing a storage unit of a flash memory, comprising:

a sector-decoding unit;

a RAID (Redundant Array of Independent Disk)-decoding unit;

a processing unit, coupled to the sector-decoding unit and the RAID-decoding unit, after receiving a notification indicating that errors presented in a message of a sector within a RAID group cannot be fixed by an error correction algorithm with a horizontal ECC (Error Correction Code) of the sector, determining addresses of the other sectors within the RAID group; providing a first information to the sector-decoding unit and the RAID-decoding unit, which indicates that a vertical correction procedure has been activated, wherein the sector-decoding unit, after receiving the first information from the processing unit, decodes the content read by the storage-unit access interfaces and transmits the decoded results to the RAID-decoding unit; directing a plurality of storage-unit access interfaces to read content from the determined addresses of the storage unit, thereby enabling the RAID-decoding unit to recover the message of the sector by using the read content; and, after the decoded results for the other sectors has been completely transmitted to the RAID-decoding unit, providing a second information to the RAID-decoding unit, which indicates that the vertical correction procedure ends, wherein the RAID-decoding unit, after receiving the second information, stores a decoded result corresponding to the previously received data for the RAID group from the sector-decoding unit to a buffer, and the decoded result corresponding to the previously received data for the RAID group is considered as the message of the sector.

9. The apparatus of claim 8, wherein the sector-decoding unit attempts to correct the errors presented in the message of the sector within the RAID group by using the error correction algorithm with the horizontal ECC, and after failing to correct the errors, sends the notification to the processing unit.

10. The apparatus of claim 8, wherein an electronic device reads the message of the sector stored in the buffer through a processing-unit access interface.

11. The apparatus of claim 8, wherein the processing unit, after the decoded results for the other sectors has been completely transmitted to the RAID-decoding unit, provides the second information to the sector-decoding unit.

12. The apparatus of claim 11, wherein the sector-decoding unit, after receiving the second information, decodes the content read by the storage-unit access interfaces and stores the decoded results to a buffer.

13. The apparatus of claim 8, wherein the other sectors comprise a vertical ECC.

14. The apparatus of claim 8, further comprising:
   a RAID-encoding unit, generating the vertical ECC according to messages within the RAID group.

* * * * *